United States Patent
Ma et al.

(10) Patent No.: US 10,608,036 B2
(45) Date of Patent: Mar. 31, 2020

(54) METAL MESH LIGHT PIPE FOR TRANSPORTING LIGHT IN AN IMAGE SENSOR

(71) Applicant: QUALCOMM Incorporated, San Diego, CA (US)

(72) Inventors: Jian Ma, San Diego, CA (US); Biay-Cheng Hseih, Irvine, CA (US); Sergiu Radu Goma, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/161,958

(22) Filed: Oct. 16, 2018

(65) Prior Publication Data
US 2019/0115386 A1 Apr. 18, 2019

Related U.S. Application Data

(60) Provisional application No. 62/573,612, filed on Oct. 17, 2017.

(51) Int. Cl.
| | |
|---|---|
| *H01L 27/146* | (2006.01) |
| *H04N 5/225* | (2006.01) |
| *H04N 5/369* | (2011.01) |
| *G01S 7/481* | (2006.01) |

(52) U.S. Cl.
CPC .. *H01L 27/14636* (2013.01); *H01L 27/14603* (2013.01); *H01L 27/14629* (2013.01); *H01L 27/14634* (2013.01); *H01L 27/14643* (2013.01); *H04N 5/2252* (2013.01); *H04N 5/369* (2013.01); *H04N 5/36965* (2018.08);
(Continued)

(58) Field of Classification Search
CPC ......... H01L 27/14621; H01L 27/14627; H01L 27/14636; H01L 27/14643; H01L 27/14603; H01L 27/14629; H01L 27/14634; H04N 5/369; H04N 5/2252; H04N 5/36965; H04N 5/379; H04N 5/374; H04N 5/3745; H04N 5/23212; H04N 5/35545; H04N 5/35563; H04N 5/3559; H04N 5/3696; G01S 7/4816
See application file for complete search history.

(56) References Cited

U.S. PATENT DOCUMENTS

| | | | |
|---|---|---|---|
| 2004/0135209 A1* | 7/2004 | Hsieh | G01J 5/02 257/368 |
| 2005/0029643 A1* | 2/2005 | Koyanagi | G02B 3/0056 257/680 |

(Continued)

FOREIGN PATENT DOCUMENTS

WO 2009146253 A1 12/2009

OTHER PUBLICATIONS

International Search Report and Written Opinion—PCT/US2018/056238—ISA/EPO—dated Jan. 25, 2019.

*Primary Examiner* — Caridad Everhart
(74) *Attorney, Agent, or Firm* — Pamela K. Soggu

(57) ABSTRACT

Various embodiments are directed to a light pipe. The light pipe may include a channel within a substrate of an image sensor. The channel may be formed by a plurality of layers. The plurality of layers may include a first layer and a second layer. The second layer may be spaced apart from the first layer along an axis of the channel.

32 Claims, 11 Drawing Sheets

(52) U.S. Cl.
CPC ............ *H04N 5/379* (2018.08); *G01S 7/4816* (2013.01); *H01L 27/14621* (2013.01); *H01L 27/14627* (2013.01)

(56) References Cited

U.S. PATENT DOCUMENTS

| | | | |
|---|---|---|---|
| 2007/0045642 A1* | 3/2007 | Li | H01L 27/1462 257/98 |
| 2007/0138380 A1* | 6/2007 | Adkisson | G01J 1/04 250/227.11 |
| 2008/0012083 A1* | 1/2008 | Gilton | G01N 21/253 257/432 |
| 2011/0242349 A1* | 10/2011 | Izuha | H01L 27/14621 348/222.1 |
| 2013/0057699 A1 | 3/2013 | Ooki et al. | |
| 2016/0322412 A1 | 11/2016 | Yamamoto et al. | |
| 2017/0179177 A1 | 6/2017 | Goma et al. | |

* cited by examiner

METAL MESH LIGHT PIPE FOR TRANSPORTING LIGHT IN AN IMAGE SENSOR

CLAIM OF PRIORITY UNDER 35 U.S.C. § 119

The present Application for Patent claims priority to Provisional Application No. 62/573,612 entitled "METAL MESH LIGHT PIPE FOR TRANSPORTING LIGHT IN AN IMAGE SENSOR" filed Oct. 17, 2017, and assigned to the assignee hereof and hereby expressly incorporated by reference herein

TECHNICAL FIELD

This disclosure relates to a metal mesh light pipe, and specifically to an image sensor including the metal mesh light pipe to transport light within the image sensor.

BACKGROUND

Image processing devices, such as digital cameras, smartphones or tablet computers, rely on image sensors to capture images. Image sensors receive light and convert that light into electrical signals. The image processing devices then transform these electrical signals into digital images.

Different types of image sensors are currently available. For example, image processing devices typically utilize either a frontside-illumination (FSI) image sensor or a backside-illumination (BSI) image sensor. An FSI image sensor is typically oriented such that light enters the top of the FSI image sensor and passes through a metal-interconnect layer before striking a light-sensing surface. In contrast, BSI image sensors are oriented to allow light to enter from the top of the BSI image sensor and to strike a light-sensing surface without passing through a metal-interconnect layer of the BSI image sensor. While each of the FSI and BSI image sensors have favorable imaging characteristics, they both have limited spectral responses.

SUMMARY OF THE INVENTION

This disclosure describes various embodiments of an image sensor with extended spectral response including a metal mesh light pipe.

Various embodiments may include a device that includes a first sensor portion and a second sensor portion. In some embodiments, the first sensor portion may include a first photodetector. In such embodiments, the second sensor portion may include a second photodetector. In some embodiments, the device may include a combined metal-interconnect layer between the first photodetector and the second photodetector. The combined metal-interconnect layer forms a light pipe including a channel formed by a plurality of layers. The plurality of layers may include a first layer and second layer. The second layer may be spaced apart from the first layer along an axis of the channel.

In some embodiments, the first layer may include a metal and the second layer may include the metal. In some embodiments, the metal may be an optical metal trace. In some embodiments, the metal may be a metal interconnect trace.

In some embodiments, a first perimeter of the first layer may continuously extend about the axis and a second perimeter of the second layer may continuously extend about the axis. In some embodiments, the first perimeter may be equal to the second perimeter.

In some embodiments, the second layer may be spaced apart from the first layer by a distance greater than 0.0 microns and less than or equal to approximately 0.5 microns.

In some embodiments, the combined metal-interconnect layer may include a first metal-interconnect layer within the first sensor portion and a second metal inter-connect layer within the second sensor portion. In some embodiments, the light pipe may include a first light pipe including a first channel formed by a first plurality of layers within the first metal-interconnect layer. In some embodiments, a second light pipe may include a second channel formed by a second plurality of layers within the second metal-interconnect layer. In some embodiments, the first light pipe and the second light pipe may be aligned about a common axis. In some embodiments, the first plurality of layers forming the first channel of the first light pipe may have a first perimeter that extends about the axis and the second plurality of layers forming the second channel of the second light pipe may have a second perimeter that extends about the axis. The first perimeter may be larger than the second perimeter.

In some embodiments, the first layer may include a first plurality of metal portions including a first metal portion of an optical metal trace and a second metal portion of a metal interconnect trace. In some embodiments, the second layer may include a second plurality of metal portions including a first metal portion of an optical metal trace and a second metal portion of a metal interconnect trace.

In some embodiments, the optical metal trace may include a plurality of edges including a first edge and a second edge opposite the first edge and the metal interconnect trace may include a plurality of edges including a third edge and a fourth edge opposite the third edge. In some embodiments, the first edge of the optical metal trace may be coupled to the third edge of the metal interconnect trace and the second edge of the optical metal trace may be spaced apart from the fourth edge of the metal interconnect trace. In some embodiments, the first edge of the optical metal trace may be spaced apart from the third edge of the metal interconnect trace. In some embodiments, the first and second edges of the optical metal trace may be spaced apart from the third and fourth edges of the metal interconnect trace. In some embodiments, the first edge of the optical metal trace may be coupled to the metal interconnect trace and the second edge of the optical metal trace may be spaced apart from the metal interconnect trace. In some embodiments, the third edge of the metal interconnect trace may be coupled to the optical metal trace and the fourth edge of the metal interconnect trace may be spaced apart from the optical metal trace.

In some embodiments, the device may include at least one of a dual bandpass filter disposed above the second photodetector or a narrow bandpass filter disposed between the first photodetector and the second photodetector.

In some embodiments, the device may include an optical transmitter. The optical transmitter may be configured to transmit a source light. In some embodiments, the device may include an optical receiver. The optical receiver may be configured to receive reflections of the source light. The optical receiver may include the first sensor portion and the second sensor portion.

In some embodiments, the device may include a processor. The processor may be configured to generate a first digital signal from a first electrical signal. The processor may be configured to generate a second digital signal from a second electrical signal. The processor may be configured to generate a combined digital signal based on the first digital signal and the second digital signal. The processor may be configured to generate a digital image based on the combined digital signal.

Various embodiments may include a method for capturing an image via an image sensor. In some embodiments, the method may include receiving light via an optical receiver. In some embodiments, the optical receiver may include an image sensor. The image sensor may include a first sensor portion and a second sensor portion. In some embodiments, the first sensor portion may include a first photodetector. In such embodiments, the second sensor portion may include a second photodetector. In some embodiments, the image sensor may include a combined metal-interconnect layer between the first photodetector and the second photodetector. The combined metal-interconnect layer may form a light pipe including a channel formed by a plurality of layers. The plurality of layers may include a first layer and second layer. The second layer may be spaced apart from the first layer along an axis of the channel.

In some embodiments, the method may include transmitting a source light via an optical transmitter. The optical receiver may receive reflections of the source light.

In some embodiments, the method may include generating, via a processor, a first digital signal from a first electrical signal. The method may include generating, via the processor, a second digital signal from a second electrical signal. The method may include generating, via the processor, a combined digital signal based on the first digital signal and the second digital signal. The method may include generating, via the processor, a digital image based on the combined digital signal.

In some embodiments, the first layer may include a metal and the second layer may include the metal. In some embodiments, the metal may be an optical metal trace. In some embodiments, the metal may be a metal interconnect trace.

In some embodiments, a first perimeter of the first layer may continuously extend about the axis and a second perimeter of the second layer may continuously extend about the axis. In some embodiments, the first perimeter may be equal to the second perimeter.

In some embodiments, the second layer may be spaced apart from the first layer by a distance greater than 0.0 microns and less than or equal to approximately 0.5 microns.

In some embodiments, the light pipe may include a first light pipe including a first channel formed by a first plurality of layers within the first sensor portion. In some embodiments, a second light pipe may include a second channel formed by a second plurality of layers within the second sensor portion. In some embodiments, the first plurality of layers forming the first channel of the first light pipe may have a first perimeter that extends about the axis and the second plurality of layers forming the second channel of the second light pipe may have a second perimeter that extends about the axis. The first perimeter may be larger than the second perimeter.

In some embodiments, the first layer may include a first plurality of metal portions including a first metal portion of an optical metal trace and a second metal portion of a metal interconnect trace. In some embodiments, the second layer may include a second plurality of metal portions including a first metal portion of an optical metal trace and a second metal portion of a metal interconnect trace.

In some embodiments, the optical metal trace may include a plurality of edges including a first edge and a second edge opposite the first edge and the metal interconnect trace may include a plurality of edges including a third edge and a fourth edge opposite the third edge. In some embodiments, the first edge of the optical metal trace may be coupled to the third edge of the metal interconnect trace and the second edge of the optical metal trace may be spaced apart from the fourth edge of the metal interconnect trace. In some embodiments, the first edge of the optical metal trace may be spaced apart from the third edge of the metal interconnect trace. In some embodiments, the first and second edges of the optical metal trace may be spaced apart from the third and fourth edges of the metal interconnect trace. In some embodiments, the first edge of the optical metal trace may be coupled to the metal interconnect trace and the second edge of the optical metal trace may be spaced apart from the metal interconnect trace. In some embodiments, the third edge of the metal interconnect trace may be coupled to the optical metal trace and the fourth edge of the metal interconnect trace may be spaced apart from the optical metal trace.

Various embodiments may include an apparatus for capturing an image via an image sensor. In some embodiments, the apparatus may include means for transmitting a source light via an optical transmitter. The apparatus may also include means for receiving light, including reflections of the source light, via an optical receiver. In some embodiments, the optical receiver may include an image sensor. The image sensor may include a first sensor portion and a second sensor portion. In some embodiments, the first sensor portion may include a first photodetector. In such embodiments, the second sensor portion may include a second photodetector. In some embodiments, the image sensor may include a combined metal-interconnect layer between the first photodetector and the second photodetector. The metal-interconnect layer may form a light pipe including a channel formed by a plurality of layers. The plurality of layers may include a first layer and second layer. The second layer may be spaced apart from the first layer along an axis of the channel.

DETAILED DESCRIPTION

Figure 1:
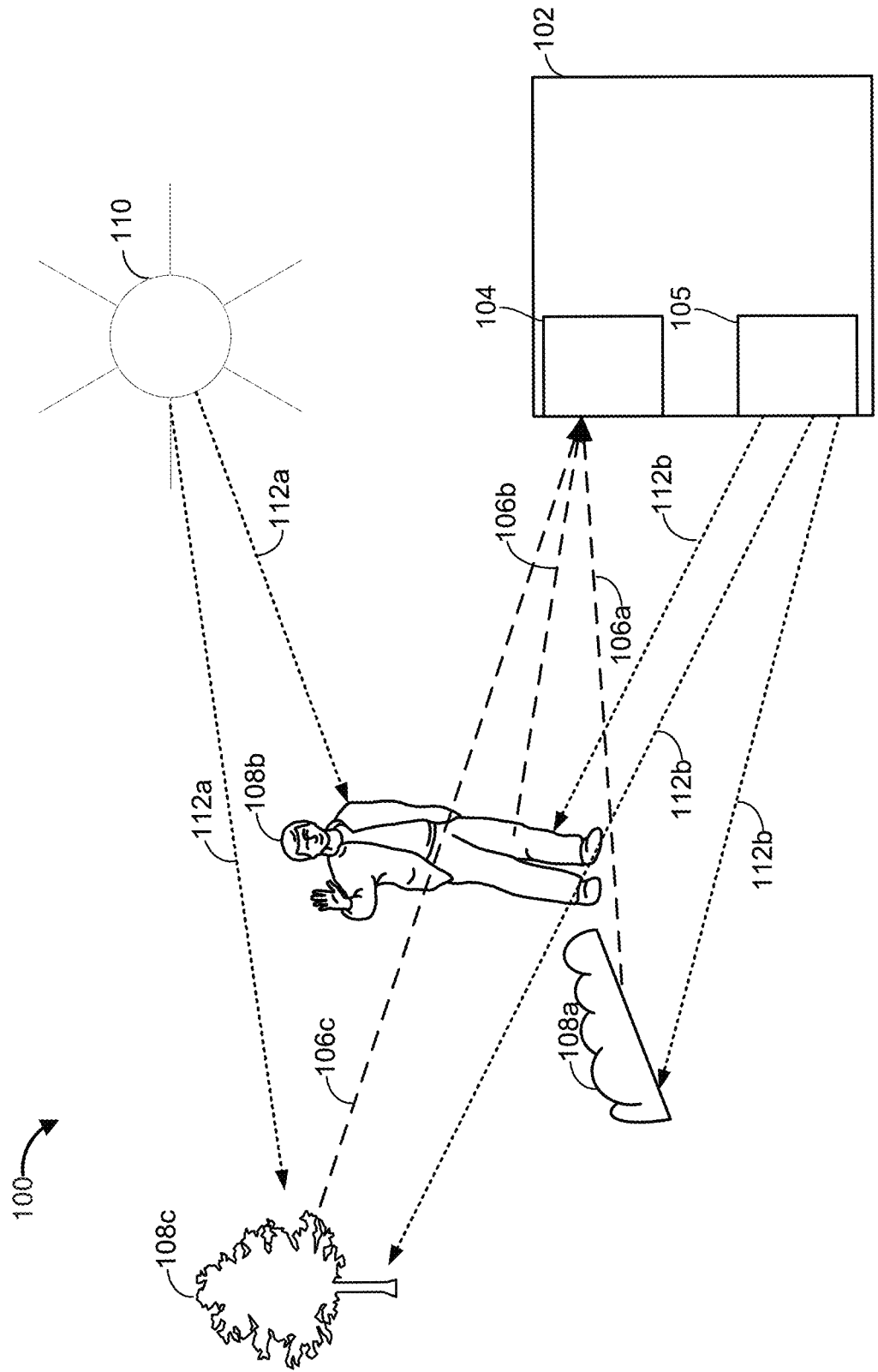
FIG. 1 is an example diagram illustrating a device and a scene including a field of view of the device.

As described herein, some components of an image sensor (e.g., an FSI or BSI image sensor) may sometimes be referred to as positioned "above," "on top of," "underneath," "below," or similar terminology in relation to some other components. For ease of description, spatial relations between components in an image sensor may be described in relation to the "top" and "bottom" of the image sensor. In some embodiments, the "top" of an image sensor may correspond with the point at which light initially strikes and/or enters the image sensor. Accordingly, the "bottom" of the image sensor may be on the opposite side of the image sensor than the top of the image sensor. Thus, a second component or element of an image sensor that is closer to the top of the image sensor than a first component may be described as being "on top of" or "above" the first component.

In embodiments described herein, certain references to an image sensor as having a "first sensor portion" (or a "first image sensor") or a "second sensor portion" (or a "second image sensor") is merely for ease of labeling and description. As such, the description of an image sensor as a "first sensor portion" or a "second image sensor" is not intended to be limiting.

The term "sensor element" may be used herein to refer to a basic component of an image sensor that may be configured to capture light information. Specifically, a sensor element may be configured to capture a portion of a photographic object such that a representation of the entire photographic image (or a larger portion) may be captured using multiple sensor elements of the image sensor. The image sensor may be described as including or having one or more sensor elements arranged as a two-dimensional array or matrix. This two-dimensional array may correspond with a particular resolution of a related digital image. More sensor elements typically correspond with higher-resolution digital images. For example, an image processing device with an image sensor having a 640×480 array of sensor elements (e.g., a 0.3 megapixel image sensor) may capture lower resolution digital images than another image processing device with an image sensor having a 4000×3000 array of sensor elements (e.g., a 12 megapixel image sensor). Any reference to an image sensor having a certain number of sensor elements is simply for ease of description and is not intended to limit any image sensor to have any particular number of sensor elements, unless otherwise indicated.

Silicon wafers used in a conventional backside-illumination (BSI) image sensor may be thin enough such that light enters from the top of the BSI wafer and strikes a light receiving surface (e.g., a photodetector) without passing through a metal-interconnect layer of the BSI image sensor. Because light does not pass through the metal-interconnect layer in a BSI wafer (e.g., BSI image sensor), light is not scattered or obstructed to the same degree as observed in frontside-illumination (FSI) image sensors. Thus, BSI image sensors generally experience better performance when detecting visible light than FSI image sensors. However, because BSI image sensors are thinner than FSI image sensors (e.g., BSI image sensors are typically less than three micrometers while FSI image sensors are typically greater than seven micrometers), BSI image sensors may not detect near-infrared ("NIR") or infrared ("IR") light as well as FSI image sensors due to the relatively longer wavelengths of NIR/IR light.

In overview, various embodiments provide for an image sensor configured to sense visible light on par with a BSI image sensor, while simultaneously being configured to sense IR or NIR light on par with an FSI image sensor. In such embodiments, the image sensor may include a first sensor portion (which may also be referred to as a first image sensor) configured to function similar to an FSI image sensor. The image sensor may further include a second sensor portion (which may be referred to as a second image sensor) configured to function similar to a BSI image sensor. The second sensor portion may be positioned on top of (e.g., coupled, attached, bonded, etc.) to the first sensor portion. The first sensor portion being configured to function similar to an FSI image sensor and the second sensor portion being configured to function similar to a BSI image sensor are for exemplary purposes only and are not meant to be a limitation of this disclosure. For example, the first sensor portion may be configured to function similar to a BSI image sensor and the second sensor portion may be configured to function similar to an FSI image sensor. Alternatively, the first sensor portion and the second sensor portion may both be configured to function similar to a BSI image sensor or the first sensor portion and the second sensor portion may both be configured to function similar to an FSI image sensor.

In various embodiments, the image sensor may be configured such that the second sensor portion is positioned on top of the first sensor portion. "Top" may be used to refer to a position such that light may enter the second sensor portion and be detected, and some of that light may pass through the second sensor portion and may be detected within the first sensor portion. By positioning the second sensor portion on top of the first sensor portion, a stacked image sensor may be formed. In some embodiments, the second sensor portion may be configured to have a thickness suitable for sensing visible light, such as by performing wafer thinning or grinding. The first sensor portion may be configured to have a thickness suitable for sensing IR or NIR light, which may not require wafer grinding or may require a lesser degree of grinding. By positioning the second sensor portion above the first sensor portion such that each sensor portion is able to capture some light from the same source (e.g., from the same direction and/or same environment), the overall light captured by the image sensor may be improved.

In some embodiments, the image sensor may include one or more optical filters. The one or more optical filters may include one or more of a dual bandpass filter disposed above a second photodetector of the second sensor portion. The one or more optical filters may include one or more of an IR or NIR narrow bandpass filter disposed between a first photodetector of the first sensor portion and the second photodetector of the second sensor portion. Optical bandpass filters are typically configured to selectively transmit wavelengths within a certain range while rejecting wavelengths outside of that range. Dual bandpass filters are typically configured to transmit two passbands (e.g., two portions of the spectrum, such as visible light and NIR/IR light). By positioning a dual bandpass filter above the second photodetector (e.g., the dual bandpass filter may be disposed anywhere above the second photodetector, such as on top of the second sensor portion), the dual bandpass filter may transmit visible and NIR/IR light while rejecting light outside of the one or more wavelength ranges associated with visible and/or NIR/IR light. The light, having been filtered by the dual bandpass filter, may then enter the second sensor portion of the image sensor. In this manner, only light within wavelength ranges associated with the dual bandpass filter may enter the image sensor (e.g., the second sensor portion) via the dual bandpass filter, such as visible light and NIR/IR light.

Narrow bandpass filters are typically configured to transmit a narrow region of the spectrum (e.g., a narrow region of the NIR or IR spectrum when using an IR or NIR narrow bandpass filter) while rejecting light outside of the narrow region of the spectrum (e.g., rejecting visible light if the narrow bandpass filter is an IR or NIR narrow bandpass filter). By disposing a narrow bandpass filter between the first photodetector of the first sensor portion and the second photodetector of the second sensor portion (e.g., the narrow bandpass filter may be disposed anywhere between the first photodetector and the second photodetector), the narrow bandpass filter may filter light that was not sensed by the second sensor portion (e.g., light that was not detected by the second photodetector) prior to the light entering the first photodetector. For example, the narrow bandpass filter may transmit light within a narrow wavelength range while rejecting light outside of the narrow wavelength range. The light, having been filtered by the narrow bandpass filter, may then enter and be detected by the first photodetector. In this manner, only light within a narrow wavelength range may enter and be detected by the first photodetector of the image sensor via the narrow bandpass filter, such as NIR and/or IR light.

In some embodiments, the first sensor portion and the second sensor portion of the image sensor may each have one or more sensor elements. The first sensor portion and the second sensor portion may be physically coupled or affixed together in such a way that each sensor element of the first sensor portion is aligned with a corresponding sensor element of the second sensor portion. Specifically, each sensor element of the first sensor portion may be positioned below a corresponding sensor element of the second sensor portion. In an example in which each of the first sensor portion and the second sensor portion has two sensor elements (e.g., a 2×1 sensor array), a first sensor element of the first sensor portion may be aligned with a corresponding sensor element (referred to as a second sensor element because the corresponding sensor element may be included within the second sensor portion) of the second sensor portion.

In some embodiments, the alignment of sensor elements of the first and second sensor portions may include aligning photodetectors and light pipes formed within a substrate between the photodetectors in the first and second sensor portions of the image sensor (e.g., as discussed with reference to FIG. 3), which may ensure that light from the same source is captured or sensed by corresponding sensor elements in the image sensor. In such embodiments, this configuration of the image sensor may enable a photodetector in the second sensor portion (referred to herein as a second photodetector because it is included within the second sensor portion) to receive visible light from a source and may also enable a corresponding photodetector in the first sensor portion (referred to herein as a first photodetector because it is included within the first sensor portion) to receive NIR or IR light from the same source. The configuration and alignment of the first and second sensor portions of the image sensor facilitates the capture of light from the same source using two photodetectors (e.g., the first photodetector and the second photodetector). As a result, the digital images created from the light captured with these photodetectors may have a higher degree of detail, particularly in low-light situations.

In some embodiments, the first sensor portion and the second sensor portion of the image sensor may be physically coupled or affixed together by bonding a first metal-interconnect layer of the first sensor portion and a second metal-interconnect layer of the second sensor portion to form a combined metal-interconnect layer. For example, the first and second metal-interconnect layers of the first and second sensor portions may be coupled by applying a metal-oxide adhesive. In another example, the first and second metal-interconnect layers of the first and second sensor portions may be coupled via Van der Waals force, such that a top portion of the first metal-interconnect layer of the first sensor portion (e.g., a top portion or top surface of the first metal-interconnect layer of the first sensor portion) and a bottom portion of the second metal-interconnect layer of the second sensor portion (e.g., a bottom portion or bottom surface of the second metal-interconnect layer of the second sensor portion) that are coupled to form the combined metal-interconnect layer may be smooth surfaces such that when the two respective surfaces come in contact, no air may be found between the two surfaces and the first sensor portion and the second sensor portion may be bonded to form the combined metal-interconnect layer.

In some embodiments, the combined metal-interconnect layer may form a light pipe between the first photodetector and the second photodetector to guide light from the first image sensor to the second image sensor. For example, the light pipe may guide light that is not absorbed by the first photodetector to the second photodetector (e.g., NIR/IR light that has longer wavelengths than visible light). The light pipe may be referred to herein as a metal mesh light pipe. The light pipe may include a first light pipe formed within the first metal-interconnect layer and a second light pipe formed within the second metal-interconnect layer. When combined, the first light pipe and the second light pipe may form the light pipe. The light pipe may include a channel (e.g., a hollow column) formed by a plurality of layers (e.g., a plurality of metal layers). The plurality of layers may include a first layer and a second layer spaced apart from the first layer along an axis of the channel (e.g., above or below). The light pipe may include any number of layers. Each of the plurality of layers may be spaced apart from a previous layer to form the metal mesh light pipe. That is, the plurality of layers may not be coupled and/or connected along the axis (e.g., vertically) in order to form a "mesh" light pipe. Electric interconnections between the layers of the light pipe should not occur within the channel (e.g., the hollow column) of the light pipe because the electric interconnections would interfere with light propagation. Rather, the interior of the light pipe (e.g., the channel or column formed by the plurality of layers) should be empty (e.g., hollow). The substrate may separate each layer from a layer above or below the layer (e.g., the substrate may separate each layer from the previous layer or the next layer along the axis of the channel). Light may travel through the channel (e.g., the hollow column) formed by the plurality of layers from the first photodetector to the second photodetector.

Various embodiments will be described in detail with reference to the accompanying drawings. Generally, the same reference numbers will be used throughout the drawings to refer to the same or similar part. References made to particular examples and implementations are for illustrative purposes only, and are not intended to limit the scope of the disclosure or the claims.

In some embodiments, the image sensor described herein may detect light within the visible range or near infrared ("NIR") or longer wavelength light (for example, infrared ("IR"), etc.). For clarity of description, "NIR light" will refer to any light with a wavelength within the NIR range and/or having a wavelength longer than NIR light.

FIG. 1 is a diagram illustrating a scene, a device 102, and various objects within the scene and within a field of view of the device 102. As shown in FIG. 1, the device 102 may include an optical receiver 104 and an optical transmitter 105. Examples of device 102 may include an image capture device, such as a camera, that may be or may be part of a desktop computer, a laptop computer, a tablet, a personal digital assistant, a personal camera, a digital camera, an action camera, a mounted camera, a connected camera, a wearable device, an automobile, a drone, a wireless communication device, a phone, a television, a display device, a digital media player, a video game console, or a video streaming device. Device 102 may be capable of capturing still or moving images, regardless of format (e.g., digital, film, etc.) or type (e.g., video camera, still camera, web camera, etc.).

Examples of optical transmitter 105 may include a projector, a laser, or the like. Examples of optical receiver 104 may include one or more optical sensors (e.g., image sensors). In some examples, optical transmitter 105 may transmit a source light (e.g., IR light, NIR, light, structured light that includes a pattern or codeword, a flash, etc.) into the scene and the optical receiver 104 may receive visible light and/or the source light reflected off of objects within the scene.

The field of view ("FOV") of device 102 may include objects 108a-c, including a bush 108a, a person 108b, and a tree 108c. The scene 100 may include an external light source 110 independent from the device 102. Example external light sources 110 may include a natural light source (e.g., the sun) or an artificial light source external from device 102. Reflected light 106a-c may represent paths of light reflected off of objects 108a-c, respectively. Emitted light 112a may represent paths of light emitted from external light source 110. Emitted light 112b may represent paths of a source light transmitted from optical transmitter 105.

Optical receiver 104 may sense light (e.g., visible signals, IR signals, and/or NIR signals), for example via optics of device 102 not shown in this figure, and thus capture an image of the FOV of device 102 based on the sensed light. The light received by optical receiver 104 may include reflections of the source light transmitted via optical transmitter 105. The light received by optical receiver 104 may include light from external light source 110 and/or reflections of light from external light source 110. In other words, optical receiver 104 may absorb the emitted light from external light source 110 directly or after it reflects off of objects 108a-c within the FOV of device 102. In some embodiments, optical transmitter 105 may transmit source light 112b when device 102 is used to capture an image. In other embodiments, the optical transmitter 105 may provide constant illumination for the duration of a sensing period of optical receiver 104. In some embodiments, optical receiver 104 and optical transmitter 105 may be two independent (e.g., separate) components that are configured to operate together. Optical receiver 104 may be configured to generate an image of the FOV based on the received light.

As with optical transmitter 105, external light source 110 may function independently of device 102 (for example, as a constantly illuminated source such as the sun) or may function dependent upon device 102 (for example, as an external flash device). For example, external light source 110 may include an exterior light that constantly emits emitted light 112a within the FOV of device 102 or in a portion of the FOV of device 102.

Device 102 may be capable of determining depth of a scene or depth of an object based on light received at optical receiver 104. The example embodiment of FIG. 1 shows optical receiver 104 receiving reflected light 106a-c from objects 108a-c within the FOV of device 102. As shown, objects 108a-c may be at various depths from device 102. However, in some embodiments, objects 108a-c may be at a single depth from device 102.

Example use cases that may be supported by depth or IR/RGB combined images may include, but are not limited to, augmented reality applications, robotics, high dynamic range (HDR) images, facial recognition and/or facial authentication, face liveness detection and/or anti-spoofing, gesture detection, and/or other use cases.

Figures 2A, 2B:
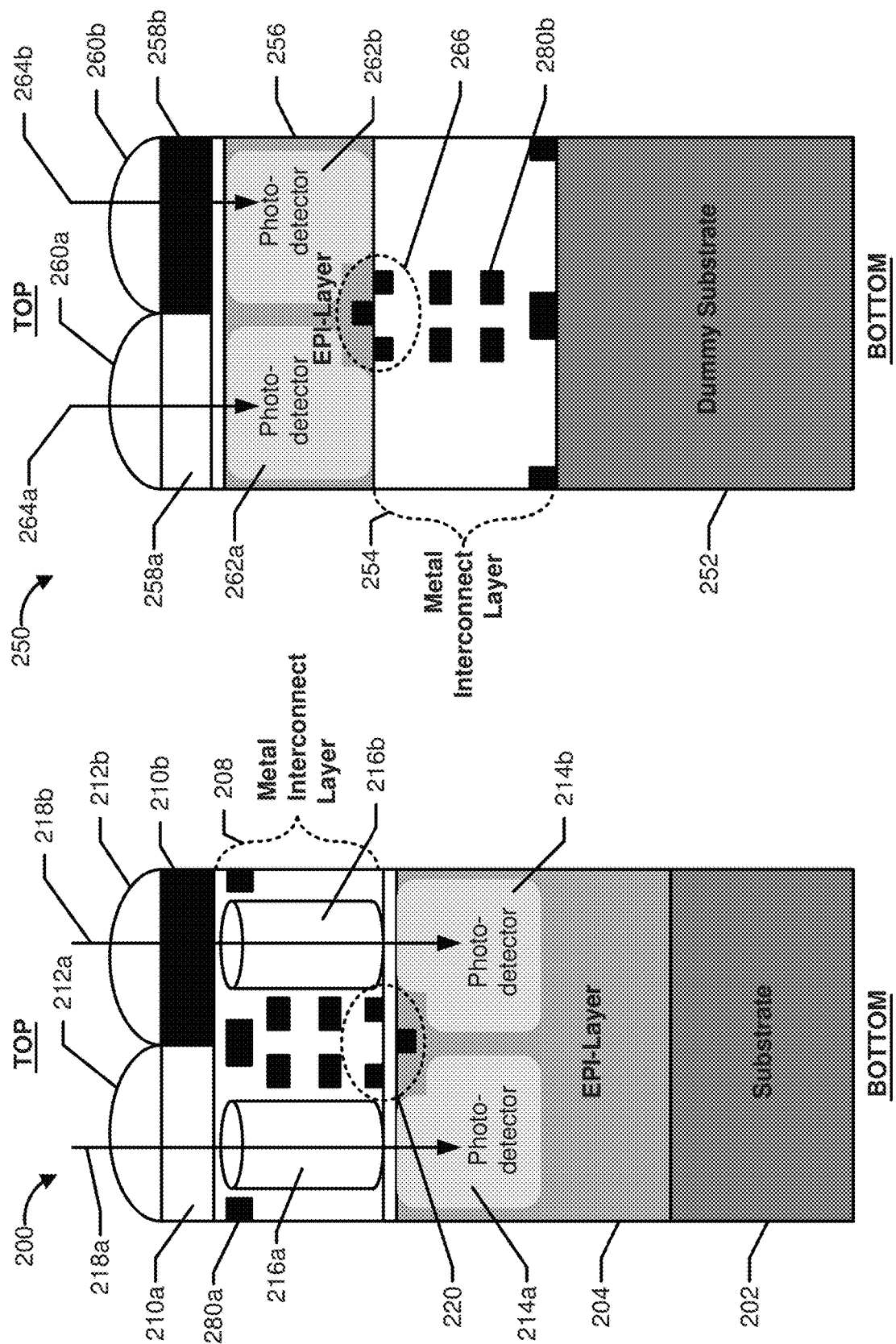
FIG. 2A is a component diagram showing a cross-sectional view of a conventional frontside-illuminated image sensor.
FIG. 2B is a component diagram showing a cross-sectional view of a conventional backside-illuminated image sensor.

FIG. 2A is a side view of a cross-section of an example embodiment of a conventional FSI image sensor 200. In this example, FSI image sensor 200 may include a substrate layer 202, an epitaxial layer 204, a metal-interconnect layer 208, and one or more micro-lenses (e.g., micro-lenses 212a and 212b). In some embodiments intended to capture color images, FSI image sensor 200 may include one or more color filters (e.g., color filters 210a and 210b). It should be noted that one or more color filters 210a and 210b are optional, as FSI image sensor 200 may not be intended to capture color images. For example, color filters 210a and 210b may not be necessary to capture black and white images.

FSI image sensor 200 may be oriented such that light (e.g., light 218a or 218b) may enter from the top of FSI image sensor 200. In the example illustrated in FIG. 2A, light 218a or 218b may enter FSI image sensor 200 via micro-lenses 212a and 212b, which focus the light 218a or 218b. Light 218a and 218b may then pass through color filters 210a, 210b. In particular, color filters 210a, 210b may block light in certain wavelengths (e.g., certain colors) such that light that passes through color filters 210a, 210b may have a particular color or may be associated with a particular range of wavelengths or colors.

After being focused by micro-lenses 212a, 212b and filtered by color filters 210a, 210b, light 218a or 218b may pass through metal-interconnect layer 208—usually through one or more light pipes 216a and 216b—to be received by one or more photodetectors 214a and 214b included within epitaxial layer 204. Metal-interconnect layer 208 may form light pipes 216a and 216b by forming a channel through metal-interconnect layer 208. Light pipes 216a and 216b may facilitate the passage of light 218a and 218b through the metal-interconnect layer 208 by restricting light 218a and 218b within the channel of light pipes 216a and 216b formed within metal-interconnect layer 208. As a result, portions of light 218a and 218b may avoid passing directly through metal-interconnect layer 208 (e.g., passing through metal-interconnect layer 208 without light pipes 216a and 216b), which may otherwise cause some of light 218a and 218b to be scattered or obstructed.

Metal-interconnect layer 208 may form light pipes 216a and 216b (e.g., light pipes 216a and 216b may be formed within metal-interconnect layer 208). Metal-interconnect layer 208 may be formed within a dielectric layer and/or substrate (e.g., SiO2). A conventional metal-interconnect layer (e.g., metal inter-connect layer 208) may include 4-6 layers of metal interconnect traces (e.g., metal interconnect traces 280a). Metal interconnect traces 280a may including wiring or transistors internal to FSI sensor 200 to serve as electrical interconnections (e.g., power supply, ground, clock, video signal lines, etc.) for FSI sensor 200. In other words, the metal interconnect traces (e.g., metal interconnect traces 280a) may be conductive in that they conduct electricity. The metal interconnect traces (e.g., metal interconnect traces 280a) may include high reflectance metals, such as aluminum (AL) or aluminum copper (ALCu), or other high reflectance metals. Copper (Cu) or other metal may be used, but may not be preferred due to its low reflectance. The number of layers of metal interconnect traces (e.g., metal interconnect traces 280a) is not a limitation of this disclosure and may vary based on the image sensor. For example, the metal-interconnect layer may have less than 4 layers of metal interconnect traces positioned above or below another or more than 6 layers of metal interconnect traces positioned above or below another. In the example of FIG. 2A, metal-interconnect layer 208 includes 3 layers of metal interconnect traces 280a. Each of metal interconnect traces 280a of metal-interconnect layer 208 may have a thickness of approximately 0.5 microns to approximately 1 micron. As shown, metal interconnect traces 280a may be spaced apart from other metal interconnect traces 280a at various depths within metal-interconnect layer 208. For example, as shown on the left and right sides of metal-interconnect layer 208, only a single metal interconnect trace 280a is depicted. However, between light pipes 216a and 216b, metal-interconnect layer 208 includes 5 metal interconnect traces 280a spaced apart vertically and horizontally. The dimensions of individual metal interconnect traces 280a may vary.

After passing through light pipes 216a and 216b, light 218a and 218b may strike photodetectors 214a and 214b, which may be configured to detect light 218a and 218b. Photodetectors 214a and 214b may convert the light energy of light 218a and 218b into electrical energy (e.g., an electrical signal). This electrical energy may be passed to metal-interconnect layer 208 via a metal-oxide-semiconductor field-effect transistor (e.g., MOSFET 220). The metal-oxide semiconductor field-effect transistor (e.g., MOSFET 220) may drive the electrical energy (e.g., an electrical signal) to one or more processors or other components (not shown) that convert the electrical energy (e.g., an electrical signal) into a digital signal that may be combined with other digital signals to form a digital image. Generally described, each of photodetectors 214a and 214b may correspond with a different sensor element in FSI image sensor 200. As such, FSI image sensor 200 illustrated in FIG. 2A may be characterized as showing two sensor elements corresponding to photodetectors 214a and 214b.

Photodetectors 214a and 214b may be included or embedded in epitaxial layer 204. Epitaxial layer 204 may typically be made from gallium nitride, or some combination of gallium, indium, aluminum, nitrogen, phosphorus, or arsenic. In the example illustrated in FIG. 2A, epitaxial layer 204 may be formed on top of substrate layer 202 through the process of epitaxy growth from substrate layer 202. Substrate layer 202 may be made from various semiconductor materials, such as crystalline silicon. In some instances, epitaxial layer 204 may be made from the same or another material as substrate layer 202. In some instances, epitaxial layer 204 may be a boron-doped, p-type semiconductor material.

FIG. 2B is a side view of a cross-section of an example embodiment of a conventional BSI image sensor 250. In the illustrated example, BSI image sensor 250 may include a dummy substrate layer 252, a metal-interconnect layer 254, an epitaxial layer 256, and one or more micro-lenses 260a and 260b. In some embodiments intended to capture color images, BSI image sensor 250 may include one or more color filters (e.g., color filters 258a and 258b). It should be noted that one or more color filters 258a and 258b are optional, as BSI image sensor 250 may not be intended to capture color images. For example, color filters 258a and 258b may not be necessary to capture black and white images.

Some components of BSI image sensor 250 may be similar to and may be used for similar purposes to the components described with reference to FSI image sensor 200. However, unlike FSI image sensors (e.g., FSI image sensor 200) that require light to pass through a metal-interconnect layer (e.g., metal-interconnect layer 20 of FSI image sensor 200), BSI image sensor 250 may be configured to sense light (e.g., via one or more photodetectors 262a and 262b) before the light passes through metal-interconnect layer 254 of BSI image sensor 250.

In the example illustrated in FIG. 2B, light 264a and 264b may be received from the top of BSI image sensor 250. As described with reference to FSI image sensor 200, light 264a and 264b may pass, respectively, through micro-lenses 260a and 260b, which may focus the light 264a and 264b, and through color filters 258a and 258b, which may filter out certain colors or wavelengths in light 264a and 264b. However, in contrast to the above description of FSI image sensor 200, light 264a and 264b may pass through color filters 258a and 258b and may be received by photodetectors 262a and 262b embedded within epitaxial layer 256. As such, light 264a and 264b may be sensed by photodetectors 262a and 262b without having to pass through metal-interconnect layer 254 because, as shown in FIG. 2B, photodetectors 262a and 262b are included within BSI image sensor 250 on top of metal-interconnect layer 254. As such, light pipes are not necessary in conventional BSI image sensor 250. Metal-interconnect layer 254 of BSI image sensor 250 may be positioned underneath epitaxial layer 256 and may be in electrical contact with epitaxial layer 256 via a MOSFET 266. Metal-interconnect layer 254 may include layers of metal interconnect traces 280b. Metal interconnect traces 280b may be similar to metal interconnect traces 280a, as discussed with reference to FIG. 2A.

Epitaxial layer 256 of BSI image sensor 250 may be similar to epitaxial layer 204 of FSI image sensor 200, except epitaxial layer 256 may have been grinded (thinned) such that light entering from the top of BSI image sensor 250 strikes a light receiving surface (e.g., photodetector 262a, 262b) without passing through metal-interconnect layer 254. Because light does not pass through the wiring of metal-interconnect layer 254 in BSI image sensor 250, light may not be scattered or obstructed to the same degree as observed in FSI image sensor 200. Further, due to the position of photodetectors 262a and 262b above metal-interconnect layer 254, BSI image sensor 250 may not require light pipes to channel the light deeper into BSI image sensor 250, in contrast to FSI image sensor 200 described above. Thus, BSI image sensor 250 may generally experience better performance when detecting visible light than FSI image sensors e.g., FSI image sensor 200). However, as noted above, the thin configuration that enables BSI image sensor 250 to capture visible light effectively also results in impairment in the ability of BSI image sensor 250 to capture NIR or IR light as well as FSI image sensor 200. Specifically, because epitaxial layer 256 of BSI image sensor 250 is thinner than epitaxial layer 204 of FSI image sensor 200, BSI image sensor 250 may not be able to detect NIR or IR light as well as FSI image sensor 200 due to the relatively longer wavelengths of NIR/IR light.

Various embodiments described herein are directed to a stacked image sensor with a metal mesh light pipe that improves conventional BSI and FSI image sensors. The stacked image sensor may provide superior visible and/or NIR/IR light detection abilities than an individual BSI image sensor and/or an individual FSI image sensor. The stacked image sensor described herein may include features similar to a BSI image sensor (or two BSI image sensors) and/or an FSI image sensor (or two FSI image sensors), as well as additional features, in a single image sensor.

Figure 3A:
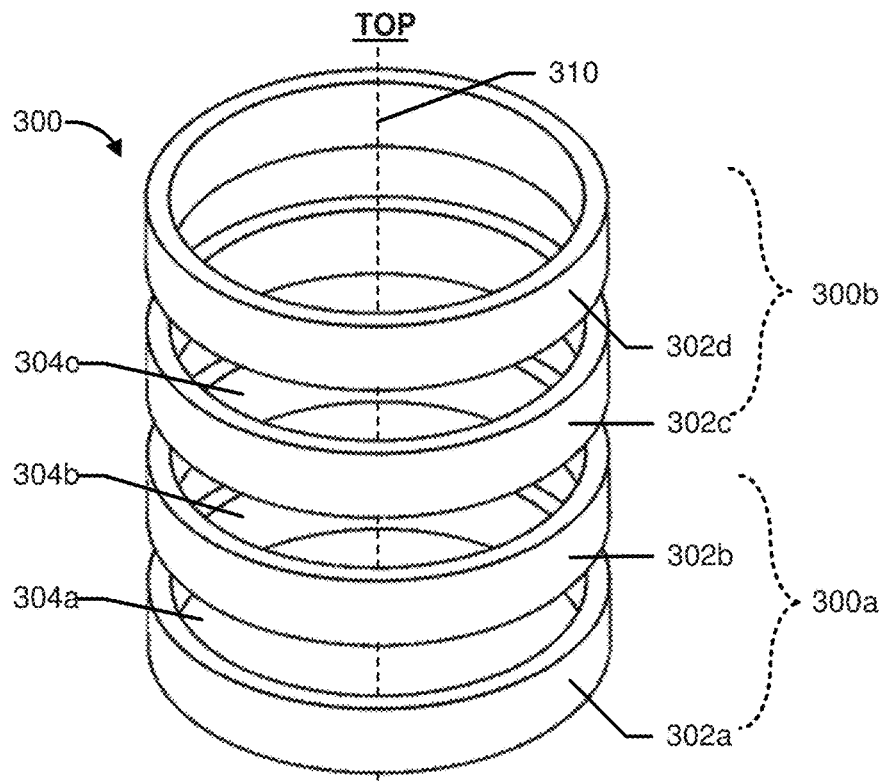
FIGS. 3A-3B are three-dimensional views of a light pipe, according to some embodiments.
Figure 3B:
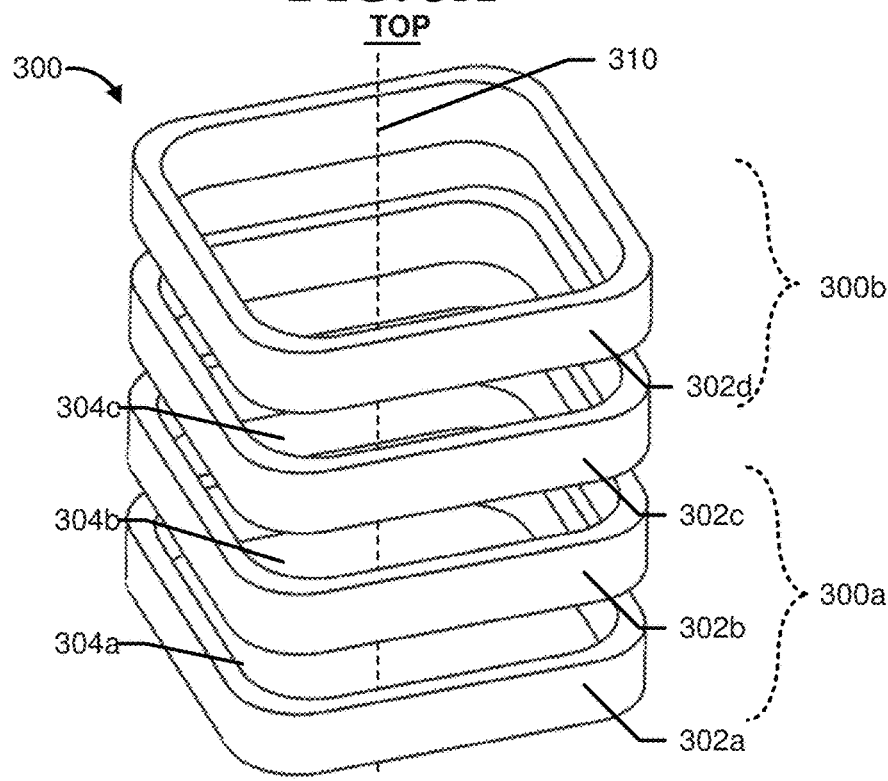

FIGS. 3A and 3B illustrate a three-dimensional view of a light pipe according to some embodiments. As shown in FIGS. 3A and 3B, light pipe 300 may take various shapes, sizes, and/or forms. For example, light pipe 300 may be a circular light pipe, as depicted in FIG. 3A, or light pipe 300 may be a square or rectangular light pipe, as depicted in FIG. 3B. The shapes and sizes of light pipe 300 are for exemplary purposes only and are not meant to be a limitation of this disclosure. For example, while light pipe 300 of FIG. 3B is depicted as having rounded corners, light pipe 300 may have sharp corners.

Light pipe 300 may include a channel (e.g., a hollow column) formed by a plurality of layers 302 (e.g., first layer 302a, second layer 302b, third layer 302c, and fourth layer 302d). The plurality of layers 302 may form the boundaries of light pipe 300. As depicted in FIGS. 3A and 3B, each layer may be spaced apart along an axis 310 (e.g., a vertical axis) of the channel from the layer above or below another layer. For example, second layer 302b is positioned above and spaced apart from first layer 302a, third layer 302c is positioned above and spaced apart from second layer 302b, and fourth layer 302d is positioned above and spaced apart from third layer 302c. While light pipe 300 of FIGS. 3A and 3B are shown as having 4 layers, this is for illustrative purposes only and is not meant to be a limitation of this disclosure. Light pipe 300 may include any number of layers.

The plurality of layers 302 may include one or more metals. The one or more metals may include an optical metal trace and/or a metal interconnect trace (as discussed above with reference to FIGS. 2A and 2B). As used herein, and as described above, a metal interconnect trace may be a metal (e.g., aluminum (AL), aluminum copper (ALCu), or any other suitable metal that has a high reflectance to light) that may serve as electrical interconnections (e.g., power supply, ground, clock, video signal lines, etc.) for the image sensor in which light pipe 300 is included. In other words, the metal interconnect trace may be conductive in that the metal interconnect trace conducts electricity. As used herein, an optical metal trace may be a metal trace (e.g., aluminum (AL), aluminum copper (ALCu), or any other suitable metal that has a high reflectance to light) that does not serve as electrical interconnections for the image sensor in which light pipe 300 is included. In other words, the optical metal trace may not act as a conductor for electricity. As such, optical metal traces may be referred to as "dummy" metal pads to help form light pipe 300 in addition to existing metal interconnect traces within the metal-interconnect layer of the image sensor. Copper (Cu) or other metal may be used for either the metal interconnect trace or the optical metal trace, but may not be preferred due to its low reflectance. As described with reference to FIGS. 2A and 2B, the metal-interconnect layer of an image sensor already includes metal interconnect traces, however the locations of each individual metal interconnect trace may be spaced apart (e.g., vertically and/or horizontally) too far to form light pipe 300 on their own. As such, one or more optical metal traces may be added to form the channel (e.g., the hollow column) of the light pipe 300. For example, one or more optical metal traces may be added where there are gaps of 0.5 microns or greater between individual metal interconnect traces to form the channel (e.g., hollow column) of light pipe 300.

As shown in FIGS. 3A and 3B, each layer 302 of light pipe 300 may be continuous or fully-connected. That is, first layer 302a is a continuous ring having a first perimeter that continuously extends about the axis 310 of the channel (e.g., the hollow column) of light pipe 300. Second layer 302b is a continuous ring having a second perimeter that continuously extends about the axis 310 of the channel (e.g., the hollow column) of light pipe 300. Third layer 302c is a continuous ring having a third perimeter that continuously extends about the axis 310 of the channel (e.g., hollow column) of light pipe 300. Fourth layer 302d is a continuous ring having a fourth perimeter that continuously extends about the axis 310 of the channel (e.g., the hollow column) of light pipe 300. In the examples of FIGS. 3A and 3B, the perimeters of each layer are equal (e.g., the first perimeter is the same as/equal to the second perimeter, and so forth). None of the layers in FIG. 3A or 3B include gaps or spaces within any of the individual layers, making each layer 302 of light pipe 300 continuous or fully-connected.

Each continuous layer may be made of the optical metal trace and/or the metal interconnect trace. For example, each of the plurality of layers 302 may be the optical metal trace. Alternatively, each of the plurality of layers 302 may be the metal interconnect trace. In some embodiments, each of the plurality of layers 302 may vary. For example, one layer may be the optical metal trace, while the remaining layers are the metal interconnect trace, or vice versa. In some embodiments, first layer 302a may be the optical metal trace, while second layer 302b may be the metal interconnect trace, or vice versa. Third layer 302c may be the metal interconnect trace, while fourth layer 302d may be the optical metal trace, or vice versa.

Each of the plurality of layers 302 may be spaced apart along the axis 310 of the channel (e.g., vertically, as shown in FIGS. 3A and 3B) by a distance greater than 0.0 microns. In some embodiments, the distance between layers along the axis 310 of the channel may be less than or equal to approximately 0.5 microns, but this is not meant to be a limitation of this disclosure, as the distance may be greater than 0.5 microns. As shown in FIGS. 3A and 3B, each of the plurality of layers 302 may be separated (e.g., spaced apart) by gap 304. Each of gaps 304 (e.g., 304a between first layer 302a and second layer 302b, gap 304b between second layer 302b and third layer 302c, and gap 304c between third layer 302c and fourth layer 302d) may vary in distance (e.g., height). For example, gap 304a may be equal to, smaller than, or greater than any of gaps 304b and/or 304c. Gaps 304 may include the dielectric layer and/or substrate in which the metal-interconnect layer/light pipe is formed within (e.g., SiO2). In this manner, light pipe 300 may be considered a metal mesh light pipe because the plurality of layers 302 are not connected/coupled to one another (e.g., not vertically connected/coupled to one another) such that the perimeter that extends about the axis 310 of the channel of each of the plurality of layers 302 form the channel (e.g., hollow column) of light pipe 300 (e.g., form the boundaries of light pipe 300), but the column is not vertically continuously made of metal (e.g., optical metal traces or metal interconnect traces). Rather, each of the plurality of layers 302 are separated along the axis 310 of the channel by dielectric layer and/or substrate (e.g., SiO2) in which the metal-interconnect layer/light pipe is formed within. As such, formation of light pipe 300 does not require use of a high index material.

Phrased another way, a top portion of a layer (e.g., first layer 302a) may be spaced apart from a bottom portion of the next layer (e.g., second layer 302b). A top portion of that layer (e.g., second layer 302) may be spaced apart from a bottom portion the next layer (e.g., third layer 302c). The top portion of a layer may be opposite the bottom portion of the layer. The top portion of a layer may refer to a top surface, a top edge, etc. The bottom portion of a layer may refer to a bottom surface, a bottom edge, etc.

In some embodiments in which light pipe 300 is included within a stacked image sensor (as described in further detailed below), light pipe 300 may include first light pipe 300a and second light pipe 300b. First light pipe 300a may be included within a first metal-interconnect layer of a first image sensor and second light pipe 300b may be included within a second metal-interconnect layer of a second image sensor. The second image sensor may be positioned above the first image sensor. Second light pipe 300b may be positioned above first light pipe 300a. First light pipe 300a may include a first channel (e.g., a first hollow column) formed by a first plurality of layers (e.g., layers 302a and 302b). Second light pipe 300b may include a second channel (e.g., a second hollow column) formed by a second plurality of layers (e.g., layers 302c and 302d). First light pipe 300a and second light pipe 300b may be aligned to form the channel (e.g., the hollow column) of light pipe 300 about a common axis (e.g., axis 310 or a different axis not shown). In this manner, light may travel from a second photodetector of the second image sensor to a first photodetector of the first image sensor.

In some embodiments (not shown), the first plurality of layers (e.g., layers 302a and 302b) forming the first channel (e.g., the first hollow column) of first light pipe 300a may have a first perimeter that extends about the common axis (e.g., axis 310 or a different axis not shown) while the second plurality of layers (e.g., layers 302c and 302d) may have a second perimeter that extends about the common axis (e.g., axis 310 or a different axis not shown). The first perimeter of first light pipe 300a may be larger than the second perimeter of second light pipe 300b. In this manner, and as will be discussed in further detail below, an opening of the top of first light pipe 300a may be larger than an opening of the bottom of second light pipe 300b in order to collect more light (e.g., reduce light loss while traveling from the second photodetector to the first photodetector). This is for exemplary purposes only, as the perimeters of any one of the plurality of layers 302 may vary/taper in size such that the perimeter of first layer 302a may be equal to, larger than, or smaller than the perimeter of second layer 302b, and the perimeter of second layer 302b may be equal to, larger than, or smaller than the perimeter of third layer 302c, and so on.

Figure 4A:
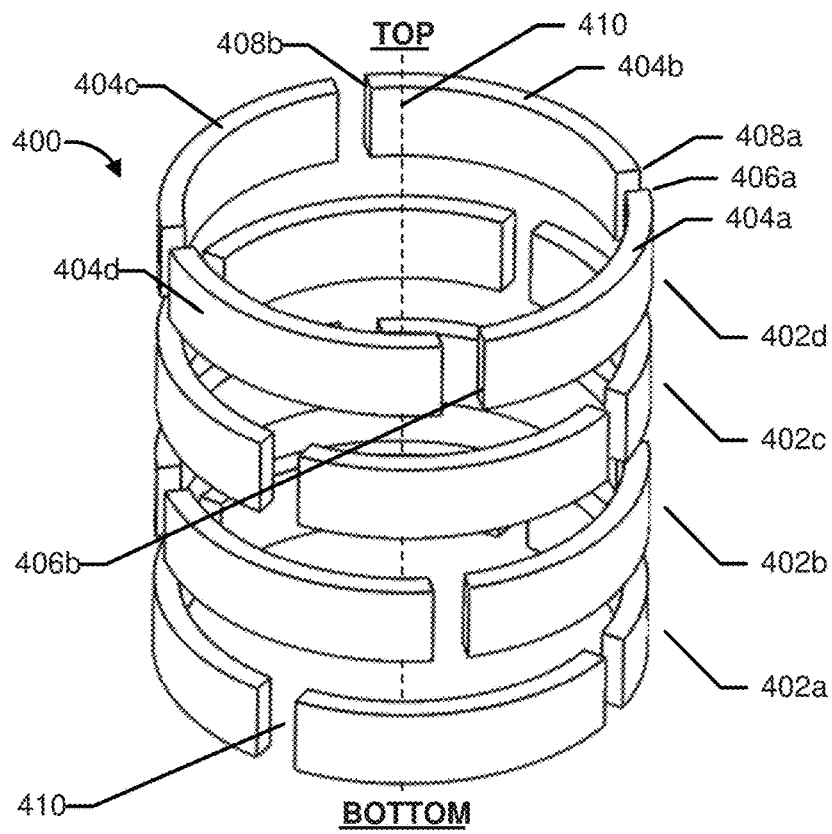
FIGS. 4A-4B are three-dimensional views of a light pipe, according to some embodiments.
Figure 4B:
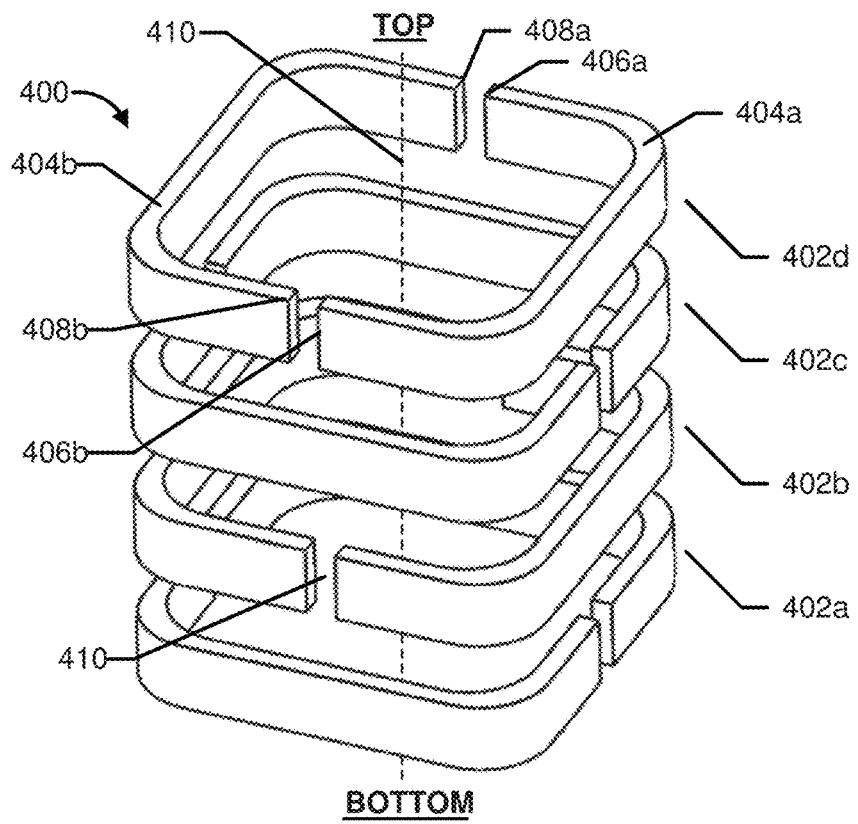

FIGS. 4A and 4B illustrate a three-dimensional view of a light pipe according to some embodiments. As shown in FIGS. 4A and 4B, light pipe 400 may take various shapes, sizes, and/or forms. For example, light pipe 400 may be a circular light pipe, as depicted in FIG. 4A, or light pipe 400 may be a square or rectangular light pipe, as depicted in FIG. 4B. The shapes and sizes of light pipe 400 are for exemplary purposes only and are not meant to be a limitation of this disclosure. For example, while light pipe 400 of FIG. 4B is depicted as having rounded corners, light pipe 400 may have sharp corners.

Light pipe 400 may be similar to that of light pipe 300 of FIGS. 3A and 3B except that light pipe 400 may include a channel (e.g., a hollow column) formed by a plurality of layers 402 (e.g., first layer 402a, second layer 402b, third layer 402c, and fourth layer 402d) that are semi-connected (as opposed to continuous or fully-connected as discussed with reference to FIGS. 3A and 3B). As depicted in FIGS. 4A and 4B, each layer is spaced apart from the layer above or below another layer along an axis 410 (e.g., a vertical axis). For example, second layer 402b is positioned above and spaced apart from first layer 402a, third layer 402c is positioned above and spaced apart from second layer 402b, and fourth layer 402d is positioned above and spaced apart from third layer 402c. While light pipe 400 of FIGS. 4A and 4B are shown as having 4 layers, this is illustrative purposes only and is not meant to be a limitation of this disclosure. Light pipe 400 may include any number of layers.

One or more of the plurality of layers 402 forming the channel (e.g., the hollow column) of light pipe 400 may include a plurality of metal portions. For example, as shown in FIG. 4A, fourth layer 402d may include a plurality of metal portions 404 (e.g., metal portions 404a, 404b, 404c, and 404d). In another example, as shown in FIG. 4B, fourth layer 402d may include a plurality of metal portions 404 (e.g., metal portions 404a and 404b). Fourth layer 402d is used for exemplary purposes only as it is easier to see the distinctions between metal portions of fourth layer 402d in FIGS. 4A and 4B, however, first layer 402a may include a first plurality of metal portions, second layer 402b may include a second plurality of metal portions, and/or so on. In some embodiments, at least one of the plurality of layers 402 of light pipe 400 may have a continuous perimeter (similar to that of FIG. 3A) while at least one of the plurality of layers 402 of light pipe 400 may include a plurality of metal portions (e.g., similar to fourth layer 402d). Any one of the plurality of layers 402 may include the same, more than, or less than the number of metal portions of any other one of the plurality of layers 402.

The plurality of metal portions in a single layer 402 may include one or more metals. The one or more metals may include an optical metal trace and/or a metal interconnect trace (as discussed above). As shown in FIGS. 4A and 4B, each metal portion of the plurality of metal portions 404 include a plurality of edges (e.g., edges 406 and 408). For example and referring to FIG. 4A, fourth layer 402d may include four metal portions 404 (e.g., first metal portion 404a, second metal portion 404b, third metal portion 404c, and fourth metal portion 404d). First metal portion 404a may be an optical metal trace while second metal portion 404b may be a metal interconnect trace. This is for exemplary purposes only, and is not meant to be a limitation of this disclosure. For example, first metal portion 404a may be a metal interconnect trace while second metal portion 404b may be an optical metal trace. Alternatively, both metal portions 404a and 404b may be the same metal (e.g., both optical metal traces or both metal interconnect traces). The same applies to metal portions 404c and 404d such that either or both of metal portions 404c and 404d may be an optical metal trace and/or a metal interconnect trace. Referring to FIG. 4B, fourth layer 402d may include two metal portions 404 (e.g., first metal portion 404a and second metal portion 404b). First metal portion 404a may be an optical metal trace while second metal portion 404b may be a metal interconnect trace. This is for exemplary purposes only, and is not meant to be a limitation of this disclosure. For example, first metal portion 404a may be a metal interconnect trace while second metal portion 404b may be an optical metal trace. Alternatively, both metal portions 404a and 404b may be the same metal (e.g., both optical metal traces or both metal interconnect traces).

Referring to FIGS. 4A and 4B, first metal portion 404a may include first edge 406a and second edge 406b. As shown, first edge 406a is opposite second edge 406b, such that first edge 406a and second edge 406b are on opposite ends (e.g., sides) of first metal portion 404a. Similarly, second metal portion 404b may include third edge 408a and fourth edge 408b. As shown, third edge 408a is opposite fourth edge 408b, such that third edge 408a and fourth edge 408b are on opposite ends (e.g., sides) of second metal portion 404b. While not shown in FIG. 4A via element numbers, third metal portion 404c and fourth metal portion 404d may include edges (e.g., sides) similar to that of first metal portion 404a and second metal portion 404b. The terms first, second, third, fourth, and so on are used for ease of description of the layers, metal portions within layers, edges/sides of metal portions, and so forth, and are not meant to be a limitation of this disclosure.

As shown in FIGS. 4A and 4B, each metal portion 404 of a single layer 402 may be spaced apart from other metal portions 404 of the same layer 402. For example, referring to FIG. 4A, first metal portion 404a may be an optical metal trace and second metal portion 404b may be a metal interconnect trace. First edge 404a of the optical metal trace (e.g., first metal portion 404a) may be spaced apart from third edge 408a of the metal interconnect trace (e.g., second metal portion 404b). Similarly, fourth edge 408b of the metal interconnect trace (e.g., second metal portion 404b) may be spaced apart from an edge of third metal portion 404c (e.g., one or both of the optical metal trace and the metal interconnect trace), while the opposite end/edge of third metal portion 404c may be spaced apart from fourth metal portion 404d (e.g., one or both of the optical metal trace and the metal interconnect trace). The opposite end of fourth metal portion 404d may be spaced apart from second edge 406b of the optical metal trace (e.g., first metal portion 404a).

Referring to FIG. 4B, first metal portion 404a may be an optical metal trace and second metal portion 404b may be a metal interconnect trace. First and second edges 406a, 406b of first metal portion 404a may be spaced apart horizontally (e.g., on the same plane) from third and fourth edges 408a, 408b of first metal portion 404a. That is, first edge 406a and third edge 408a may be spaced apart within the same layer (e.g., fourth layer 402d) and second edge 406b and fourth edge 408b may be spaced apart within the same layer (e.g., fourth layer 402d).

Different metal portions within a single layer may be spaced apart because if the optical metal trace is directly coupled to a metal interconnect trace, the optical metal trace will become a part of the electrical interconnects of the image sensor. Thus, at least one end (e.g., edge) of the optical metal trace should not be coupled (e.g., attached, connected, fixed, bonded, etc.) to a metal interconnect trace. Alternatively, if multiple optical metal traces are coupled together within the same layer via the edges forming a string of optical metal traces, at least one end (e.g., edge) of the string of the optical metal traces should not be coupled to a metal interconnect trace within the same layer. The optical metal traces should not affect the existing electric connections established by the metal interconnect traces.

Each of the plurality of metal portions (e.g., 404a-404d) of a single layer may be spaced apart (e.g., within the layer) by a distance greater than 0.0 microns. In some embodiments, the distance between metal portions may be less than or equal to approximately 0.5 microns, but this is not meant to be a limitation of this disclosure, as the distance may be greater than 0.5 microns. As shown in FIGS. 4A and 4B, each of the plurality of metal portions 404 may be separated by gap 410. Each of gaps 410 may vary in distance. For example, a gap 410 between 2 metal portions of a single layer may be equal to, smaller than, or greater than any other of gaps 410 within the same layer or of other layers. Gaps 410 may include the dielectric layer and/or substrate (e.g., SiO2) in which the metal-interconnect layer/light pipe is formed within. While not shown in FIGS. 4A and 4B with reference to element numbers, light pipe 400 may include gaps between layers, similar to gaps 304 of FIGS. 3A and 3B. In this manner, light pipe 400 may be considered a metal mesh light pipe because the plurality of layers 402 are not connected/coupled to one another (e.g., not vertically connected/coupled to one another along the axis 410) such that the perimeter of each of the plurality of layers 402 form the channel (e.g., the hollow column) of light pipe 400, but the column is not vertically continuously made of metal (e.g., optical metal traces or metal interconnect traces). Rather, each of the plurality of layers 402 are separated along the axis 410 by dielectric layer and/or substrate (e.g., SiO2) in which the metal-interconnect layer/light pipe is formed within. As such, formation of light pipe 400 does not require use of a high index material. Further, as shown in FIGS. 4A and 4B the perimeter of the plurality of metal portions forming a single layer of the boundary of light pipe 400 about the axis 410 may also not be continuous. In this instance, when a single layer 402 of light pipe 400 is not continuous, the perimeter of the single layer 402 may refer to the distance to trace the entire length/boundary of the layer about the axis 410, including any metal portions and any space or gaps between metal portions within the layer.

Figure 5A:
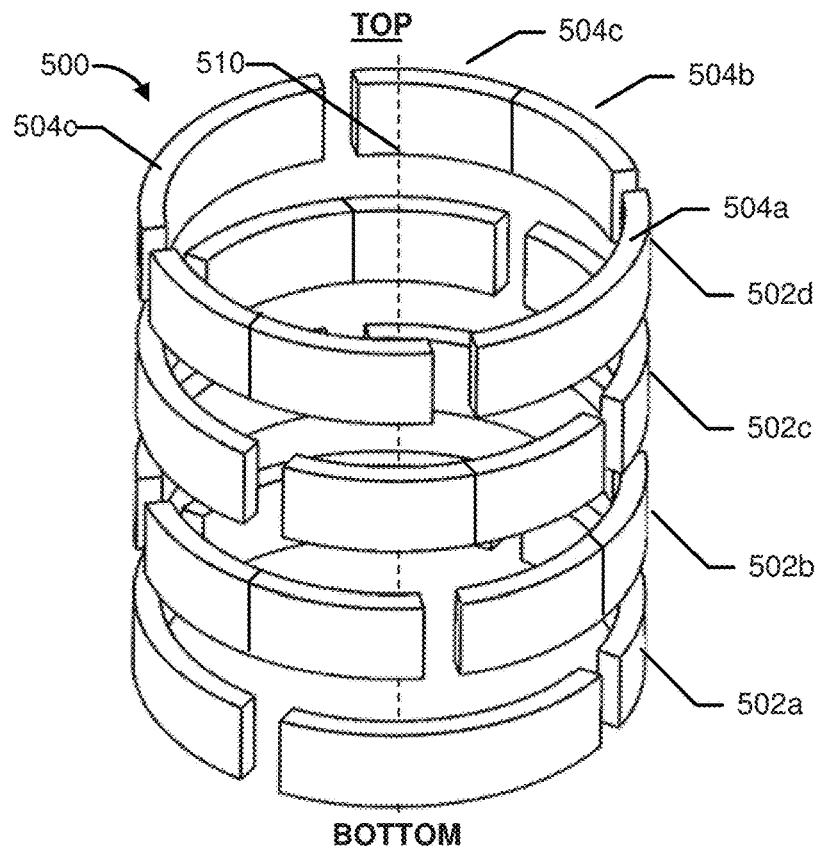
FIGS. 5A-5B are three-dimensional views of a light pipe, according to some embodiments.
Figure 5B:
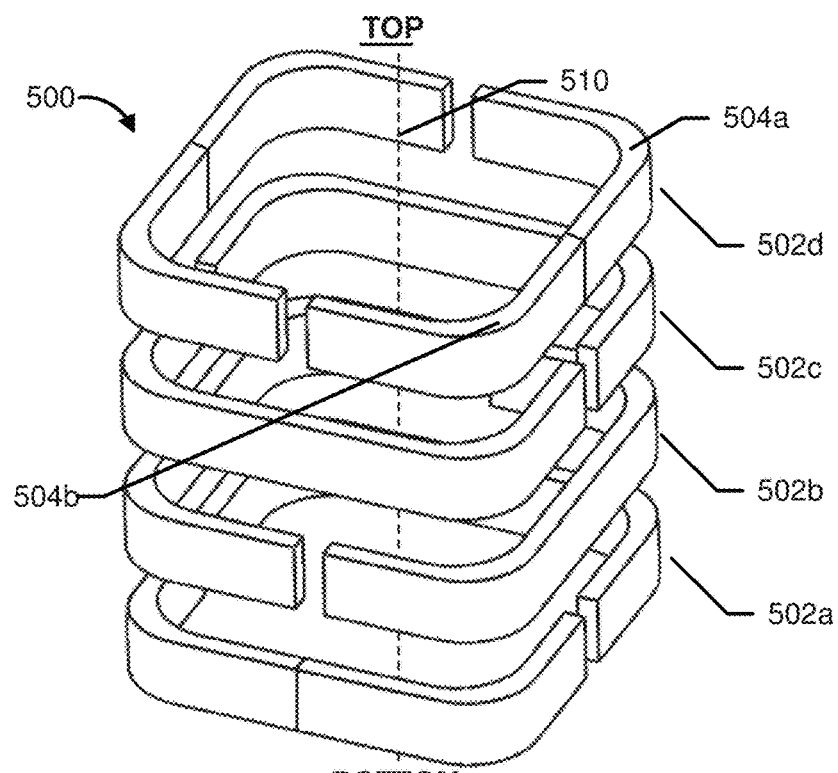

FIGS. 5A and 5B illustrate a three-dimensional view of a light pipe according to some embodiments. As shown in FIGS. 5A and 5B, light pipe 500 may take various shapes, sizes, and/or forms. For example, light pipe 500 may be a circular light pipe, as depicted in FIG. 5A, or light pipe 500 may be a square or rectangular light pipe, as depicted in FIG. 5B. The shapes and sizes of light pipe 500 are for exemplary purposes only and are not meant to be a limitation of this disclosure. For example, while light pipe 500 of FIG. 5B is depicted as having rounded corners, light pipe 500 may have sharp corners.

Light pipe 500 may be similar to that of light pipes 300 and 400 of FIGS. 3A and 3B and FIGS. 4A and 4B in that light pipe 500 may include a channel (e.g., a hollow column) formed by a plurality of layers 502 (e.g., first layer 502a, second layer 502b, third layer 502c, and fourth layer 502d) extending about an axis 510 (e.g., a vertical axis) where one or more of the plurality of layers 502 include a plurality of metal portions 504 (similar to that of FIGS. 4A and 4B), but one or more of the plurality of metal portions 504 in a single layer may be coupled to one or more other metal portions within the single layer.

Referring to FIG. 5A, fourth layer 502d may include at least 6 metal portions. Metal portions 504a, 504b, and 504c will be discussed for ease of description. For exemplary purposes only, it will be assumed that metal portion 504a is a metal interconnect trace, metal portion 504b is an optical metal trace, and 504c is a metal interconnect trace. Similar to FIGS. 4A and 4B, each of the metal portions 504 include at least a first edge and a second edge (e.g., sometimes referred to a third edge and a fourth edge). As shown in FIG. 5A, an edge of metal portion 504b may be coupled to an edge of 504c. As such, an edge of an optical metal trace may be coupled to an edge of a metal interconnect trace. As shown, a gap may exist within fourth layer 502d between the other edge of metal portion 504b (e.g., the edge opposite to the edge coupled to metal portion 504c) and metal portion 504a. Similarly, a gap may exist within fourth layer 502d between the other edge of metal portion 504c (e.g., the edge opposite to the edge coupled to metal portion 504b) and metal portion 504c. As discussed above, the gap may exist because if the optical metal trace is directly coupled to a metal interconnect trace, the optical metal trace will become a part of the electrical interconnects of the image sensor. The optical metal traces should not affect the existing electric connections established by the metal interconnect traces. Thus, at least one end (e.g., edge) of the optical metal trace should not be coupled (e.g., attached, connected, fixed, bonded, etc.) to a metal interconnect trace. FIG. 5B similarly depicts two metal portions (e.g., 504a and 504b) coupled at a single edge of each of the two metal portions while the opposite ends/edges of the metal portions are spaced apart from the next metal portion within the same layer. For illustrative purposes only, metal portion 504a may be an optical metal trace and 504b may be a metal interconnect trace. Alternatively, 504a may be a metal interconnect trace and 504b may be an optical metal trace.

Figure 6:
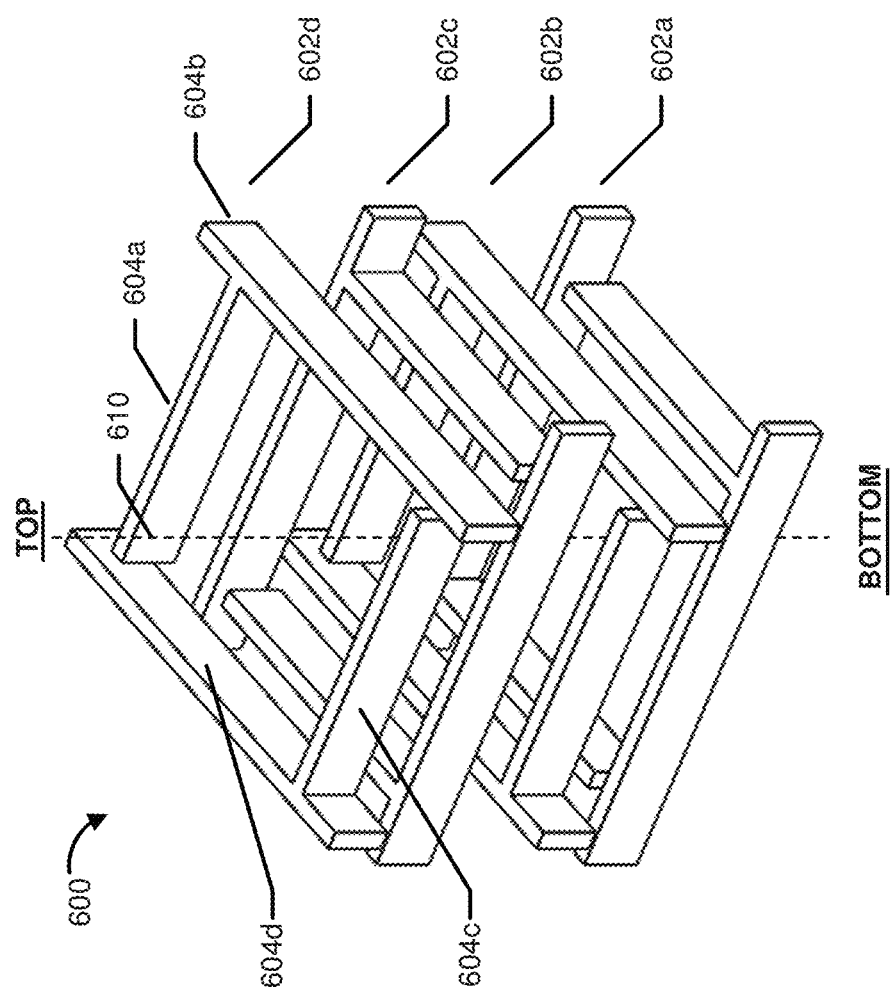
FIGS. 6 is a three-dimensional view of a light pipe, according to some embodiments.

FIG. 6 illustrates a three-dimensional view of a light pipe according to some embodiments. As shown in FIG. 6, light pipe 600 may take various shapes, sizes, and/or forms. Light pipe 600 may be similar to that of light pipes 300, 400, and/or 500 of FIGS. 3A and 3B, FIGS. 4A and 4B, and/or FIGS. 5A and 5B in that light pipe 600 may include a channel (e.g., a hollow column) formed by a plurality of layers 602 (e.g., first layer 602a, second layer 602b, third layer 602c, and fourth layer 602d) extending about an axis 610 (e.g., a vertical axis) where one or more of the plurality of layers 602 include a plurality of metal portions 604 (similar to that of FIGS. 4A and 4B and FIGS. 5A and 5B), but one or more of the plurality of metal portions 604 in a single layer may be coupled to one or more other metal portions within the single layer (similar to that of FIGS. 5A and 5B). The plurality of layers 602 may be spaced apart from one another.

As shown in FIG. 6, rather than two edges of two metal portions being coupled together in a single layer (e.g., an edge of an optical metal trace coupled to an edge of a metal interconnect trace, as depicted in FIGS. 5A and 5B), an edge of a metal portion (e.g., metal portion 604a as an optical metal trace, for example) is coupled to another metal portion (e.g., metal portion 604b as a metal interconnect trace, for example), but not necessarily at an edge of that metal portion (e.g., metal portion 604b). The other end/edge of metal portion 604a may be spaced apart from metal portion 604d (e.g., an optical metal trace or a metal interconnect trace). Further, an end of metal portion 604c may be coupled to metal portion 604d, but not necessarily at an end/edge of metal portion 604d. In this manner, different shapes, sizes, and/or forms of light pipe 600 may be formed via the plurality of layers 602.

While not shown in the figures, other shapes or forms of the light pipe that may be contemplated include a helix or spiral light pipe. Placement of the optical metal traces may be placed in such a manner with the existing metal interconnect traces to form a spiral boundary of the channel (e.g., the hollow column) of the light pipe.

Figure 7:
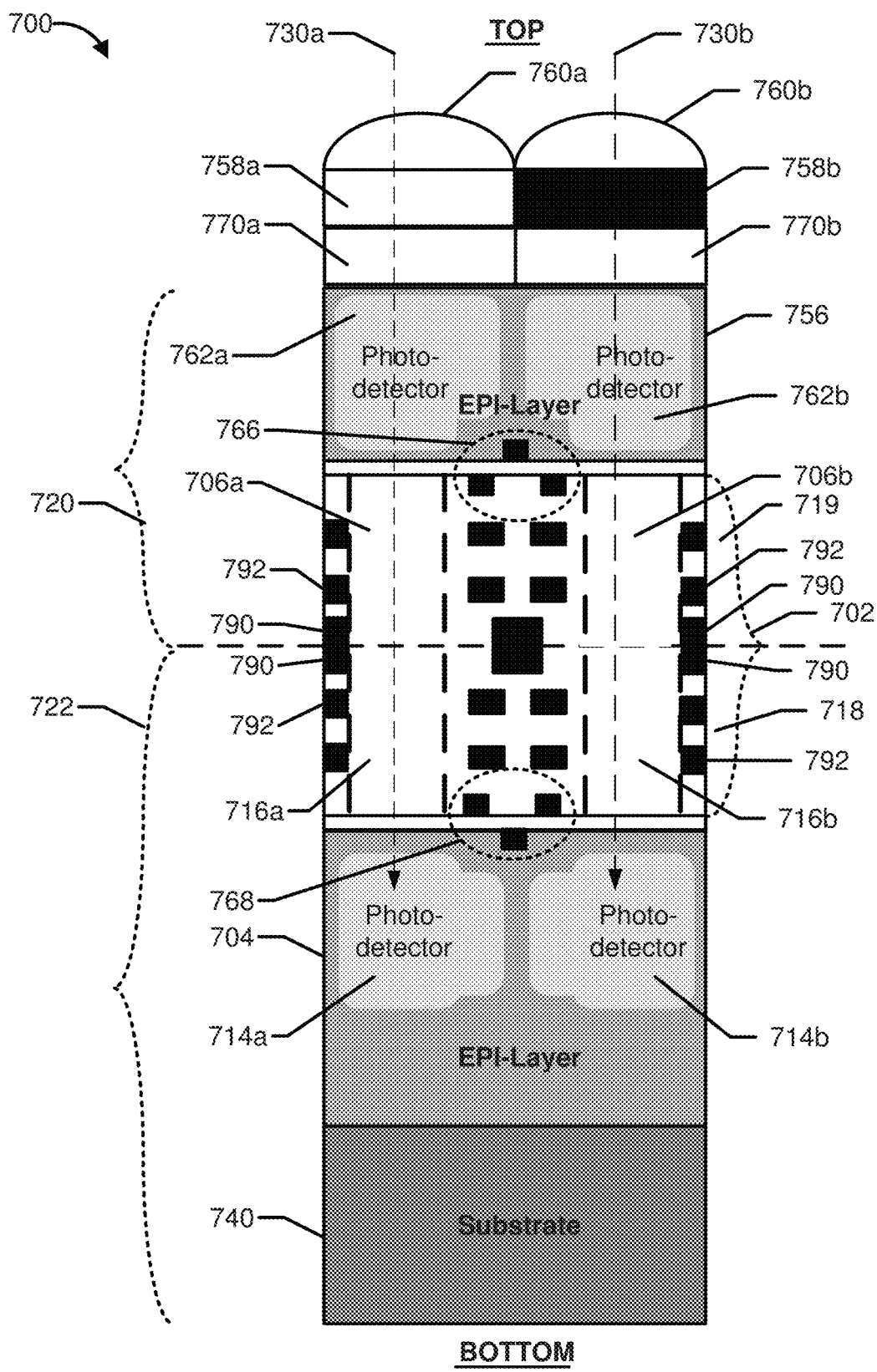
FIG. 7 is a component block diagram showing a cross-sectional view of an image sensor including a light pipe, according to some embodiments.

FIG. 7 illustrates a side view of a cross-section of an exemplary embodiment of an image sensor 700 including a metal mesh light pipe. Generally described, image sensor 700 may represent a combination of some aspects of a BSI image sensor (e.g., BSI image sensor 250 of FIG. 2B) and/or an FSI image sensor (e.g., FSI image sensor 200 of FIG. 2A), whereby components corresponding to a BSI image sensor (e.g., second sensor portion 720) may be positioned on top of components corresponding to a FSI image sensor (e.g., first sensor portion 722).

Image sensor 700 may include first sensor portion 722, second sensor portion 720, and combined metal-interconnect layer 702. First sensor portion may include first substrate 740, first epitaxial layer 704, first photodetectors 714a and 714b (each corresponding to a sensor element of image sensor 700), first MOSFET 768, first metal-interconnect layer 718, and first light pipes 716a and 716b (each corresponding to a sensor element of image sensor 700). Second sensor portion 720 may include second epitaxial layer 756, second photodetectors 762a and 762b (each corresponding to a sensor element of image sensor 700), second MOSFET 766, second metal-interconnect layer 719, and second light pipes 706a and 706b (each corresponding to a sensor element of image sensor 700). In some embodiments, image sensor 700 may be configured to leverage the presence of second photodetectors 762a and 762b in second sensor portion 720, as well as first photodetectors 714a and 714b in first sensor portion 722 to effectively capture both visible light and IR/NIR light.

Image sensor 700 may include micro-lenses 760a and 760b. In some embodiments intended to capture color images, image sensor 700 may include color filters 758a and 758b. If image sensor 700 is monochrome, color filters 758a and 758b may be omitted. Image sensor 700 may include one or more optical filters 770a and 770b. The one or more optical filters may include any optical filters including, but not limited to, interference filters, dichroic filters, absorptive filters, monochromatic filters, infrared filters, ultraviolet filters, longpass filters, bandpass filters, shortpass filters, and/or other optical filters. As described above, dual bandpass filters may be configured to transmit two passbands (e.g., two portions of the spectrum, such as visible light and NIR/IR light). For exemplary purposes only, optical filters 770a and 770b may be referred to as dual bandpass filters disposed within image sensor 700, but is not meant to be a limitation of this disclosure. Example dual bandpass filters include DB940, DB850, and/or other dual bandpass filters. In some embodiments, optical filters 770a and 770b may refer to narrow bandpass filters, infrared filters, near-infrared filters, or any other optical filter. In some embodiments, optical filter 770a may refer to one type of optical filter while optical filter 770b may refer to a second type of optical filter different from the first type of optical filter.

Light 730a and 730b, prior to being received by image sensor 700, may include reflections of a source light (for example, a source light transmitted via optical transmitter 105 of FIG. 1) and/or may include light from an external light source (reflected or directly). Light 730a and 730b may include a first portion which may include light within a first wavelength range (e.g., a wavelength range associated with NIR/IR light) and a second portion which may include light within a second wavelength range (e.g., a wavelength range associated with visible light). The first and second wavelengths ranges may be different and/or portions of the first and second wavelength ranges may overlap. By disposing optical filters 770a and 770b (e.g., for example, dual bandpass filters) above second photodetectors 762a and 762b (e.g., on top of second sensor portion 720), optical filters 770a and 770b may be configured to transmit a first portion of light 730a and 730b and a second portion of light 730a and 730b within wavelength ranges associated with optical filters 770a and 770b while rejecting light outside of the wavelength ranges associated with optical filters 770a and 770b.

Optical filters 770a and 770b may be coated or embedded above second photodetectors 762a and 762b (e.g., within a top portion of second sensor portion 720), such that optical filters 770a and 770b may be considered "on-chip" of image sensor 700. Materials of optical filters 770a and 770b are not particularly limited as long as the materials of optical filters 770a and 770b may transmit light within wavelengths suitable for image sensor 700. For example, at least one of the wavelength ranges associated with optical filters 770a and 770b may correspond to a wavelength of the source light transmitted via optical transmitter 105 of FIG. 1. Light 730a and 730b, having been filtered by optical filters 770a and 770b, may then enter second sensor portion 720. In this manner, only light within wavelength ranges associated with optical filters 770a and 770b may enter second sensor portion 720 via optical filters 770a and 770b, such as visible light and/or NIR/IR light.

While FIG. 7 is shown as image sensor 700 having optical filters 770a and 770b disposed immediately or directly beneath color filters 758a and 758b and immediately or directly on top of second photodetector 762a and 762b, this is for exemplary purposes only and is not meant to be a limitation of this disclosure. Optical filters 770a and 770b (e.g., dual bandpass filters) may be disposed anywhere above second photodetectors 762a and 762b such that light 730a and 730b is filtered prior to entering second photodetectors 762a and 762b. For example, in another example embodiment, optical filters 770a and 770b may be disposed immediately or directly beneath micro-lenses 760a and 760b and immediately or directly on top of color filters 758a and 758b. In some embodiments, optical filters 770a and 770b may only be included within image sensor 700 when color filters 758a and 758b are included within image sensor 700. In other embodiments, image sensor 700 may include optical filters 770a and 770b without color filters 758a and 758b. In other embodiments, optical filters 770a and 770b may be disposed above micro-lenses 760a and 760b. In such an embodiment, micro-lenses 760a and 760b may be encased within a substance having a low index such that the substance may form a flat or substantially flat surface for optical filters 770a and 770b to be disposed immediately or directly on top of or immediately or directly below the flat or substantially flat surface encasing micro-lenses 760a and 760b.

As described above (e.g., with reference to FIG. 2B), micro-lenses 760a and 760b may be configured to focus light 730a and 730b entering the top of image sensor 700, color filters 758a and 758b may be configured to selectively filter out certain colors of light 730a and 730b, and optical filters 770a and 770b may be configured to selectively filter out certain wavelengths of light 730a and 730b while transmitting certain wavelengths of light 730a and 730b. Second sensor portion 720 of image sensor 700 may include second epitaxial layer 756, which may have been grinded or thinned to a thickness that is suitable for receiving visible light. For example, second epitaxial layer 756 may have a thickness of approximately three to five micrometers. Second epitaxial layer 756 may include second photodetectors 762a and 762b. Second photodetectors 762a and 762b may be configured to receive at least the first portion of light 730a and 730b that has passed through micro-lenses 760a and 760b, optional color filters 758a and 758b, and optical filters 770a and 770b. Second epitaxial layer 756 may be in electrical contact with combined metal-interconnect layer 702 via second MOSFET 766.

Second photodetectors 762a and 762b may convert the at least received visible light into a second electrical signal that is sent to combined metal-interconnect layer 702. The second electrical signal may pass through combined metal-interconnect layer 702 to processing resources (not shown) that may convert the second electrical signal into a second digital signal. This second digital signal may be combined with other digital signals, such as from other sensor elements in image sensor 700, to generate a combined digital image.

In some embodiments, combined metal-interconnect layer 702 of image sensor 700 may be fabricated by affixing or bonding a bottom portion of second metal-interconnect layer 719 of second sensor portion 720 to a top portion of first metal-interconnect layer 718 of first sensor portion 722. For example, the bottom of metal-interconnect layer 254 of BSI image sensor 250 (FIG. 2B) may be physically joined or coupled to the top of metal-interconnect layer 208 of FSI image sensor 200 (FIG. 2A) to form combined metal-interconnect layer 702. However, unlike metal-interconnect layer 254 of BSI image sensor 250 (e.g., as described with reference to FIG. 2B), combined metal-interconnect layer 702 may include second light pipes 706a and 706b formed within second metal-interconnect layer 719 of combined metal-interconnect layer 702 to guide light 730a and 730b—particularly IR and/or NIR light—to pass/travel from second sensor portion 720 to first sensor portion 722 of image sensor 700.

Boundaries of second light pipes 706a and 706b are depicted in FIG. 7 with dashed lines. Second light pipes 706a and 706b may include any of or a portion of any of lights pipes 300-600 as described above with reference to FIGS. 3A, 3B, 4A, 4B, 5A, 5B, and 6. As shown in FIG. 7, second metal-interconnect layer 719 may include one or more metal interconnect traces 790 (e.g., metal traces that serve as electrical interconnections, such as power supply, ground, clock, video signal lines, etc.). Metal interconnect traces 790 are depicted within FIG. 7 as mesh boxes 790. As shown on the left and right sides of image sensor 700, large gaps/spaces may exist between metal interconnect traces 790 (e.g., either between layers or within layers). In order to form the boundary of second light pipes 706a and 706b within second metal-interconnect layer 719, optical metal traces 792 may be added to fill the gaps between metal interconnect traces 790. As such, the channel (e.g., the hollow column) of second light pipes 706a and 706b may be formed by layers of optical metal traces and/or metal interconnect traces. As shown in FIG. 7, metal interconnect traces 790 and optical metal traces 792 illustrate the plurality of layers (e.g., from top to bottom or bottom to top) forming second light pipes 706a and 706b. For example, second light pipes 706a and 706b are shown as having three layers, however any number of layers may exist to form second light pipes 706a and 706b. First light pipes 716a and 716b may be formed in a similar manner.

In some embodiments, first sensor portion 722 of image sensor 700 may include first metal-interconnect layer 718 (e.g., a bottom portion of combined metal-interconnect layer 702), which may correspond to a metal-interconnect layer of an FSI image sensor (e.g., metal-interconnect layer 208 as described with reference to FIG. 2A). As such, the bottom portion of combined metal-interconnect layer 702 (e.g., first metal-interconnect layer 718) may include first light pipes 716a and 716b formed within first metal-interconnect layer 718 of combined metal-interconnect layer 702. As shown in FIG. 3, second light pipes 706a and 706b may be positioned on top of first light pipes 716*a* and 716*b*. First and second light pipes 716*a* and 716*b*, 706*a* and 706*b* may form a cavity or channel (e.g., a hollow column) within combined metal-interconnect layer 702 such that first and second light pipes 716*a* and 716*b*, 706*a* and 706*b* may guide light 730*a* and 730*b* from second photodetectors 762*a* and 762*b* to first photodetectors 714*a* and 714*b*.

Because the wavelengths of IR/NIR light are longer than visible light, IR/NIR light may pass through second photodetectors 762*a* and 762*b* without being detected by second photodetectors 762*a* and 762*b*. Instead, IR/NIR light (e.g., the first portion of the received light 730*a* and 730*b*) may continue traveling through light pipes 706*a*, 706*b* and 716*a*, 716*b* (e.g., second and first light pipes 706*a*, 706*b* and 716*a*, 716*b*, respectively). In some embodiments, light pipes 706*a*, 716*a* and 706*b*, 716*b* may be configured to control the directionality of IR/NIR light in order to reduce signal cross talk between sensor elements.

First photodetectors 714*a* and 714*b* may be configured to receive at least the first portion of light 730*a* and 730*b* (e.g., NIR/IR light). First photodetectors 714*a* and 714*b* may be included or embedded in first epitaxial layer 704 of first sensor portion 722. Further, first epitaxial layer 704 may be formed from or coupled to first substrate layer 740. First epitaxial layer 704 may be in electrical contact with combined metal-interconnect layer 702 via first MOSFET 768.

In some embodiments, the thickness of first photodetector 714*a* may be configured to be thick enough to ensure that IR/NIR light may be captured/detected. For example, first epitaxial layer 704 may be configured to have a thickness of eight to twenty micrometers. Further, while first photodetector 714*a* is described as capturing IR/NIR light, in some embodiments, first photodetector 714*a* may also capture visible light that has passed through second photodetector 762*a*. First photodetector 714*a* may receive and convert at least a portion of the first portion of light (e.g., IR/NIR light) into a first electrical signal, which is sent through first MOSFET 768 into combined metal-interconnect layer 702 and driven to processing resources (now shown). These processing resources may convert the first electrical signal into a first digital signal that may be combined with other digital signals from other sensor portions to generate a combined digital image. For example, the first digital signal and the second digital signal may be combined to generate a combined digital signal. A digital image may then be generated based at least in part on the combined digital signal.

In some embodiments, the first and second electrical signals generated from second photodetectors 762*a*, 762*b* and first photodetectors 714*a*, 714*b* may be combined to increase the quality of the digital signal that is ultimately generated from these signals. In particular, because second photodetectors 762*a*, 762*b* may be configured to be particularly sensitive to visible light, and because first photodetectors 714*a*, 714*b* may be positioned within image sensor 700 to effectively sense IR/NIR light, signals representing both visible and NIR/IR light from these photodetectors 714*a*, 714*b* and 762*a*, 762*b* may be combined and converted into a digital image. This digital image may reflect a better representation of both visible light information (e.g., day vision) and NIR/IR light information (e.g., night vision) than digital images generated using only one sensor portion (e.g., only one FSI image sensor or BSI image sensor). Also, because photodetectors 762*a*, 762*b* and 714*a*, 714*b* are detecting light from the same environment and/or source, image sensor 700 may effectively capture twice the amount of light as a conventional image sensor without any additional noise due to optical filters 770*a*, 770*b* rejecting any unwanted or unintended light from the environment. As a result, image sensor 700 may generate more information using smaller photodetectors.

As described above, second sensor portion 720 of image sensor 700 may be characterized as having two sensor elements corresponding with at least two second photodetectors 762*a* and 762*b*. Similarly, first sensor portion 722 of image sensor 700 may be characterized as having two sensor elements corresponding with at least two first photodetectors 714*a* and 714*b*. In some embodiments, the sensor elements of second sensor portion 720 and corresponding sensor elements of first sensor portion 722 may be aligned. In particular, in such embodiments, first photodetectors 714*a* and 714*b* and first light pipes 716*a* and 716*b* of first sensor portion 722 may be aligned with second photodetectors 762*a* and 762*b* and second light pipes 706*a* and 706*b* of second sensor portion 720 to allow light 730*a* and 730*b* to pass through both sensor portions 720 and 722 of image sensor 700. For example, second photodetector 762*a* of second sensor portion 720 may be aligned with first photodetector 714*a* of first sensor portion 722, and second light pipe 706*a* of second sensor portion 720 may be aligned with first light pipe 716*a* of first sensor portion in order to enable light 730*a* to be captured by both photodetectors 714*a* and 762*a*.

In some embodiments, first light pipe 716*a* and second light pipe 706*a* may be aligned about a first common axis. Similarly, first light pipe 716*b* and second light pipe 706*b* may be aligned about a second common axis. The first and second common axis may be different. In some embodiments, first photodetector 714*a* and second photodetector 762*a* may be aligned about a third common axis. Similarly, first photodetector 714*b* and second photodetector 762*b* may be aligned about a fourth common axis. The third and fourth common axis may be different. The first and third common axis may be the same or different. The second and fourth common axis may be the same or different.

Figure 8:
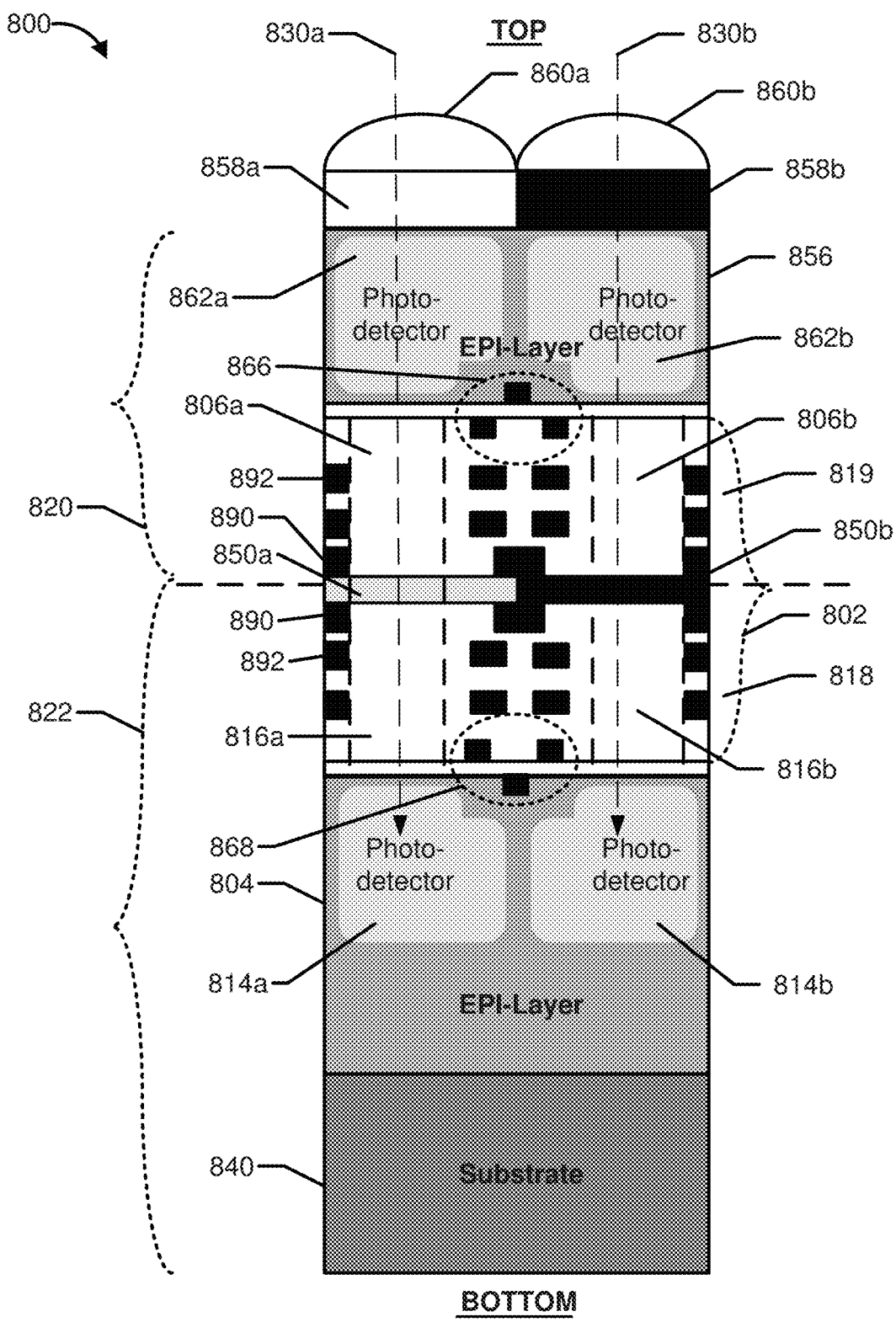
FIG. 8 is a component block diagram showing a cross-sectional view of an image sensor including a light pipe, according to some embodiments.

FIG. 8 illustrates a side view of a cross-section of an example image sensor 800 including a metal mesh light pipe. Image sensor 800 may be similar to image sensor 700 of FIG. 7, except one or more optical filters 850*a* and 850*b* may be disposed within image sensor 800 between first photodetectors 814*a* and 814*b* and second photodetectors 862*a* and 862*b* (e.g., one or more optical filters 850*a* and 850*b* may be disposed within image sensor 800 between first sensor portion 822 and second sensor portion 820), rather than one or more optical filters 870*a* and 870*b* disposed above/on top of the second photodetector of the second sensor portion, as shown with reference to image sensor 700. This is for exemplary purposes only, and is not meant to be a limitation of this disclosure. For example, image sensor 700 of FIG. 7 and/or image sensor 800 of FIG. 8 may include both optical filters. That is, image sensor 800 of FIG. 8 may include optical filters 850*a* and 850*b* in addition to optical filters 770*a* and 770*b* (e.g., dual bandpass filters) of FIG. 7 disposed above second photodetectors 862*a* and 862*b*. Further, image sensor 700 of FIG. 7 may include optical filters 770*a* and 770*b* in addition to optical filters 850*a* and 850*b* disposed between second photodetectors 862*a* and 862*b* and first photodetectors 814*a* and 814*b*.

Image sensor 800 may include first sensor portion 822 and second sensor portion 820. First sensor portion may include first substrate 840, first epitaxial layer 804, first photodetectors 814*a* and 814*b* (each corresponding to a sensor element of image sensor 800), first MOSFET 868, first metal-interconnect layer 818, and first light pipes 816*a* and 816*b*

(each corresponding to a sensor element of image sensor 800). Second sensor portion 820 may include second epitaxial layer 856, second photodetectors 862a and 862b (each corresponding to a sensor element of image sensor 800), second MOSFET 866, second metal-interconnect layer 819, and second light pipes 806a and 806b (each corresponding to a sensor element of image sensor 800). In some embodiments, image sensor 800 may be configured to leverage the presence of second photodetectors 862a and 862b in second sensor portion 820, as well as first photodetectors 814a and 814b in first sensor portion 822 to effectively capture both visible light and IR/NIR light.

Light 830a and 830b, prior to being received by image sensor 800, may include reflections of a source light (for example, a source light transmitted via optical transmitter 105 of FIG. 1) and/or may include light from an external light source (reflected or directly). Light 830a and 830b may include a first portion which may include light within a first wavelength range (e.g., a wavelength range associated with NIR/IR light) and a second portion which may include light within a second wavelength range (e.g., a wavelength range associated with visible light). The first and second wavelengths ranges may be different and/or portions of the first and second wavelength ranges may overlap.

Image sensor 800 may include micro-lenses 860a and 860b. In some embodiments intended to capture color images, image sensor 800 may include color filters 858a and 858b. If image sensor 800 is monochrome, color filters 858a and 858b may be omitted. As described above, micro-lenses 860a and 860b may be configured to focus light 830a and 830b entering the top of image sensor 800, and color filters 858a and 858b may be configured to selectively filter out certain colors of light 830a and 830b. Second sensor portion 820 of image sensor 800 may include second epitaxial layer 856, which may have been grinded or thinned to a thickness that is suitable for receiving visible light. For example, second epitaxial layer 856 may have a thickness of approximately three to five micrometers. Second epitaxial layer 856 may include second photodetectors 862a and 862b, which may be configured to receive at least the first portion light 830a and 830b that has passed through micro-lenses 860a and 860b and optional color filters 858a and 858b. As discussed above, second photodetectors 862a and 862b may be included or embedded in second epitaxial layer 856. Second epitaxial layer 856 may be in electrical contact with combined metal-interconnect layer 802 via second MOSFET 866.

Second photodetectors 862a and 862b may be configured to convert the at least received second portion of light (e.g., visible light) into a second electrical signal that is sent to combined metal-interconnect layer 802. The second electrical signal may pass through combined metal-interconnect layer 802 to processing resources (not shown) that may convert the second electrical signal into a second digital signal. This second digital signal may be combined with other digital signals, such as from other sensor elements in image sensor 800, to generate a combined digital image.

In some embodiments, combined metal-interconnect layer 802 of image sensor 800 may be fabricated by affixing or bonding a bottom portion of second metal-interconnect layer 819 of second sensor portion 820 to a top portion of first metal-interconnect layer 818 of first sensor portion 822. For example, the bottom of metal-interconnect layer 254 of BSI image sensor 250 (FIG. 2B) may be physically joined or coupled to the top of metal-interconnect layer 208 of FSI image sensor 200 (FIG. 2A) to form combined metal-interconnect layer 802. However, unlike metal-interconnect layer 254 of BSI image sensor 250 (e.g., as described with reference to FIG. 2B), combined metal-interconnect layer 802 may include second light pipes 806a and 806b formed within second metal-interconnect layer 818 of combined metal-interconnect layer 802 to guide light 830a and 830b—particularly IR or NIR light—to pass/travel from second sensor portion 820 to first sensor portion 822 of image sensor 800.

Boundaries of second light pipes 806a and 806b are depicted in FIG. 8 with dashed lines. Second light pipes 806a and 806b may include any of or a portion of any of lights pipes 300-600 as described above with reference to FIGS. 3A, 3B, 4A, 4B, 5A, 5B, and 6. As shown in FIG. 8, second metal-interconnect layer 819 may include one or more metal interconnect traces 890 (e.g., metal traces that serve as electrical interconnections, such as power supply, ground, clock, video signal lines, etc.). Metal interconnect traces 890 are depicted within FIG. 8 as mesh boxes 890. As shown on the left and right sides of image sensor 800, large gaps/spaces may exist between metal interconnect traces 890 (e.g., either between layers or within layers). In order to form the boundary of second light pipes 806a and 806b within second metal-interconnect layer 819, optical metal traces 892 may be added to fill the gaps between metal interconnect traces 890. As such, the channel (e.g., the hollow column) of second light pipes 806a and 806b may be formed by layers of optical metal traces and/or metal interconnect traces. As shown in FIG. 8, metal interconnect traces 890 and optical metal traces 892 illustrate the plurality of layers (e.g., from top to bottom or bottom to top) forming second light pipes 806a and 806b. For example, second light pipes 806a and 806b are shown as having three layers, however any number of layers may exist to form second light pipes 806a and 806b. First light pipes 816a and 816b may be formed in a similar manner.

In some embodiments, first sensor portion 822 of image sensor 800 may include first metal-interconnect layer 818 (e.g., a bottom portion of combined metal-interconnect layer 802), which may correspond to a metal-interconnect layer of an FSI image sensor (e.g., metal-interconnect layer 208 as described with reference to FIG. 2A). As such, the bottom portion of combined metal-interconnect layer 802 (e.g., first metal-interconnect layer 818) may include first light pipes 816a and 816b formed within first metal-interconnect layer 818 of combined metal-interconnect layer 802. As shown in FIG. 8, second light pipes 806a and 806b may be positioned on top of first light pipes 816a and 816b. First and second light pipes 816a, 816b, and 806a, 806b may form a cavity or channel (e.g., hollow column) within combined metal-interconnect layer 802 and may guide light 830a and 830b from second photodetectors 862a and 862b to first photodetectors 814a and 814b.

In the exemplary embodiment of FIG. 8, image sensor 800 may include one or more optical filters 850a and 850b disposed between first photodetectors 816a and 816b and second photodetectors 862a and 862b. The one or more optical filters may include any optical filters including, but not limited to, interference filters, dichroic filters, absorptive filters, monochromatic filters, infrared filters, ultraviolet filters, longpass filters, bandpass filters, shortpass filters, and other filters. As described above, IR and/or NIR bandpass filters may be configured to transmit a narrow passband associated with the NIR and/or IR spectrum (e.g., such as NIR/IR light). For exemplary purposes only, optical filters 850a and 850b may be referred to as IR or NIR bandpass filters disposed within image sensor 800, but is not meant to be a limitation of this disclosure. Example narrow bandpass filters may include 830 nm, 940 nm, and/or other narrow bandpass filters. In some embodiments, optical filters 850a and 850b may refer to dual bandpass filters or any other filter. In some embodiments, optical filters 850a may refer to one type of filter while optical filter 850b may refer to a second type of filter, different from the first type of filter.

Optical filters 850a and 850b (e.g., for example, IR or NIR narrow bandpass filters) may be disposed between first photodetectors 816a and 816b and second photodetectors 862a and 862b. For example, optical filters 850a and 850b may be disposed on top of first metal-interconnect layer 818, including first light pipes 816a and 816b, of first sensor portion 822, such that optical filters 850a and 850b may be disposed on top of first metal-interconnect layer 818 and/or first light pipes 816a and 816b. Optical filters 850a and 850b may be embedded within first light pipes 816a and 816b. Alternatively, optical filters 850a and 850b may be disposed on the bottom of second metal-interconnect layer 819, including second light pipes 806a and 806b, of second sensor portion 820, such that optical filters 850a and 850b may be disposed on the bottom of second metal-interconnect layer 819 and/or second light pipes 806a and 806b. Optical filters 850a and 850b may be embedded within second light pipes 806a and 806b. By disposing optical filters 850a and 850b (e.g., for example, IR or NIR narrow bandpass filters) between first photodetectors 816a and 816b and second photodetectors 862a and 862b, optical filters 850a and 850b may transmit the first portion of light 830a and 830b (e.g., NIR/IR light) within wavelength ranges associated with optical filters 850a and 850b (e.g., NIR or IR light) while rejecting light outside of the wavelength ranges associated with optical filters 850a and 850b prior to the first portion of light 830a and 830b (e.g., NIR/IR light) entering first photodetectors 814a and 814b.

Optical filters 850a and 850b may be coated or embedded within the top portion the first metal-interconnect layer 818 of first sensor portion 822 prior to bonding first sensor portion 822 and second sensor portion 820, such that optical filters 850a and 850b may be considered "on-chip" of image sensor 800. Alternatively, optical filters 850a and 850b may be coated or embedded within the bottom portion of second metal-interconnect layer 819 of second sensor portion 820 prior to bonding first sensor portion 822 and second sensor portion 820, such that optical filters 850a and 850b may be considered "on-chip" of image sensor 800. Optical filters 850a and 850b may be coated or embedded within first light pipes 816a and 816b or second light pipes 806a and 806 at the time of forming first light pipes 816a and 816b or second light pipes 806a and 806, such that optical filters 850a and 850b may be considered "on-chip" of image sensor 800. Alternatively, optical filters 850a and 850b may be coated or embedded between first sensor portion 822 and second sensor portion 820 at the time of bonding first sensor portion 822 and second sensor portion 820, such that optical filters 850a and 850b may be considered "on-chip" of image sensor 800. Materials of optical filters 850a and 850b are not particularly limited as long as the materials of optical filters 850a and 850b transmit light within wavelengths suitable for image sensor 800. For example, at least one of the wavelength ranges associated with optical filters 850a and 850b may correspond to a wavelength of the source light transmitted via optical transmitter 105 of FIG. 1.

While FIG. 8 is shown as image sensor 800 having optical filter 850a disposed between second and first light pipes 806a and 816a, respectively, and optical filter 850b disposed between second and first light pipes 806b and 816b, respectively, this is for exemplary purposes only and is not meant to be a limitation of this disclosure. For example, in another example embodiment, optical filters 850a and 850b may be disposed immediately or directly beneath first light pipes 816a and 816b and immediately or directly on top of first photodetectors 814a and 814b. In some embodiments, optical filters 850a and 850b may only be included within image sensor 800 when color filters 858a and 858b are not included within image sensor 800 and/or when optical filters 770a and 770b (e.g., dual bandpass filters of FIG. 7) are not included within image sensor 800. In other embodiments, it may be contemplated that optical filters 850a and 850b may be disposed immediately or directly above or on top of second light pipes 806a and 806b and immediately or directly below second photodetectors 862a and 862b.

Light 830a and 830b, having been filtered by optical filters 850a and 850b, may then enter first sensor portion 822 from second sensor portion 820. In this manner, only light within wavelength ranges associated with optical filters 850a and 850b may enter first sensor portion 822 via optical filters 850a and 850b, such as NIR and/or IR light. First photodetectors 814a and 814b may be configured to receive at least the first portion of light 830a and 830b. First photodetectors 814a and 814b may be included or embedded in first epitaxial layer 804 of first sensor portion 822. Further, first epitaxial layer 804 may be formed from or coupled to first substrate layer 840. First epitaxial layer 804 may be in electrical contact with combined metal-interconnect layer 802 via first MOSFET 868.

Because the wavelengths of IR/NIR light are longer than visible light, IR/NIR light may pass through second photodetectors 862a and 862b without being detected by second photodetectors 862a and 862b. Instead, IR/NIR light (e.g., the first portion of the received light 830a and 830b) may continue traveling through light pipes 806a, 806b and 816a, 816b (e.g., second and first light pipes 806a, 806b and 816a, 816b, respectively). In some embodiments, light pipes 806a, 806b and 816a, 816b may be configured to control the directionality of IR/NIR light in order to reduce signal cross talk between sensor elements. In addition, light pipes 806a, 806b and 816a, 816b may form a collimated guide to reduce the angle of incidence upon which the first portion of the light (e.g., IR/NIR light) may strike/fall incidence upon optical filter 850a.

After passing through light pipes 806a and 816a, IR/NIR light may fall incident upon optical filter 850a. Some optical filters cause light to shift wavelengths when the light strikes the optical filter at an angle of incidence greater than a threshold. In such a case, light intended to be detected by the image sensor is rejected. Second light pipes 806a and 806b help collimate IR/NIR light to reduce the angle of incidence at which IR/NIR light strikes optical filters 850a and 850b. As discussed above, optical filters 850a and 850b being disposed between first light pipes 816a, 816b and second light pipes 806a, 806b is for exemplary purposes only, as optical filters 850a, 850b may be disposed anywhere between first photodetectors 814a, 814b and second photodetectors 862a, 862b (e.g., immediately below second photodetectors 862a, 862b or immediately above first photodetectors 814a, 814b or embedded somewhere within first light pipes 816a, 816b or second light pipes 806a, 806b).

Upon the light being filtered by optical filters 850a, 850b (e.g., a IR/NIR narrow bandpass filter), first photodetectors 814a, 814b may be configured to receive at least the first portion of the light (e.g., IR/NIR light). In some embodiments, the thickness of first photodetectors 814a, 814b may be configured to be thick enough to ensure that IR/NIR light may be captured/detected. For example, first epitaxial layer

804 may be configured to have a thickness of eight to twenty micrometers. First photodetectors 814a, 814b may receive and convert at least a portion of the first portion of light (e.g., IR/NIR light) into a first electrical signal, which is sent through first MOSFET 868 into combined metal-interconnect layer 802 and driven to processing resources (now shown). These processing resources may convert the first electrical signal into a first digital signal that may be combined with other digital signals from other sensor portions to generate a combined digital image. For example, the first digital signal and the second digital signal may be combined to generate a combined digital signal. A digital image may then be generated based at least in part on the combined digital signal.

In some embodiments, the first and second electrical signals generated from second photodetectors 862a, 862b and first photodetectors 814a, 814b may be combined to increase the quality of the digital signal that is ultimately generated from these signals. In particular, because second photodetectors 862a, 862b may be configured to be particularly sensitive to visible light, and because first photodetectors 514a, 514b may be positioned within image sensor 800 to effectively sense IR/NIR light, signals representing both visible and NIR/IR light from these photodetectors 814a, 814b and 862a, 862b may be combined and converted into a digital image. This digital image may reflect a better representation of both visible light information (e.g., day vision) and NIR/IR light information (e.g., night vision) than digital images generated using only one image sensor. Also, because photodetectors 862a, 862b and 814a, 814b are detecting light from the same environment and/or source, image sensor 800 may effectively capture twice the amount of light as a conventional image sensor without any additional noise due to optical filters 850a, 850b rejecting any unwanted or unintended light from the environment. As a result, image sensor 800 may generate more information using smaller photodetectors.

As described above, second sensor portion 820 of image sensor 800 may be characterized as having two sensor elements corresponding with at least two second photodetectors 862a and 862b. In some embodiments, first light pipe 816a and second light pipe 806a may be aligned about a first common axis. Similarly, first light pipe 816b and second light pipe 806b may be aligned about a second common axis. The first and second common axis may be different. In some embodiments, first photodetector 814a and second photodetector 862a may be aligned about a third common axis. Similarly, first photodetector 814b and second photodetector 862b may be aligned about a fourth common axis. The third and fourth common axis may be different. The first and third common axis may be the same or different. The second and fourth common axis may be the same or different.

Figure 9:
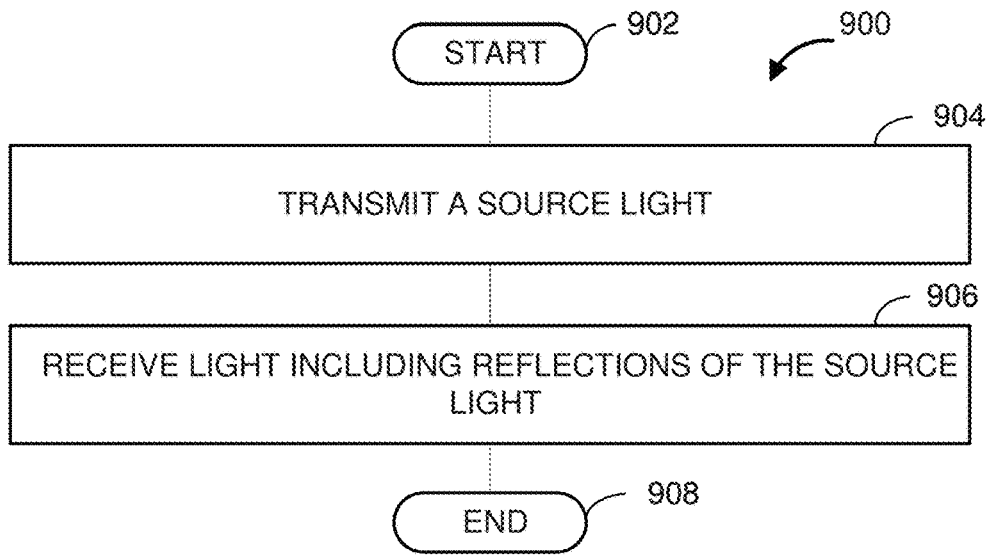
FIGS. 9-10 are flowcharts of methods for capturing an image via an image sensor, according to some embodiments.

FIG. 9 is a flowchart of a method of capturing an image via an image sensor, according to some embodiments. The method 900 may begin at block 902 and proceed to block 904. At block 904, the method 900 may transmit a source light. As discussed with reference to FIG. 1, the source light may be transmitted via an optical transmitter. The method 900 may then proceed to block 906. At block 906, the method 900 may receive light including reflections of the source light. The received light may include light from external sources. As discussed with reference to FIG. 1, the received light may be received at an optical receiver. The optical receiver may include an image sensor, such any of the image sensors described herein. The method 900 may end at block 908.

Figure 10:
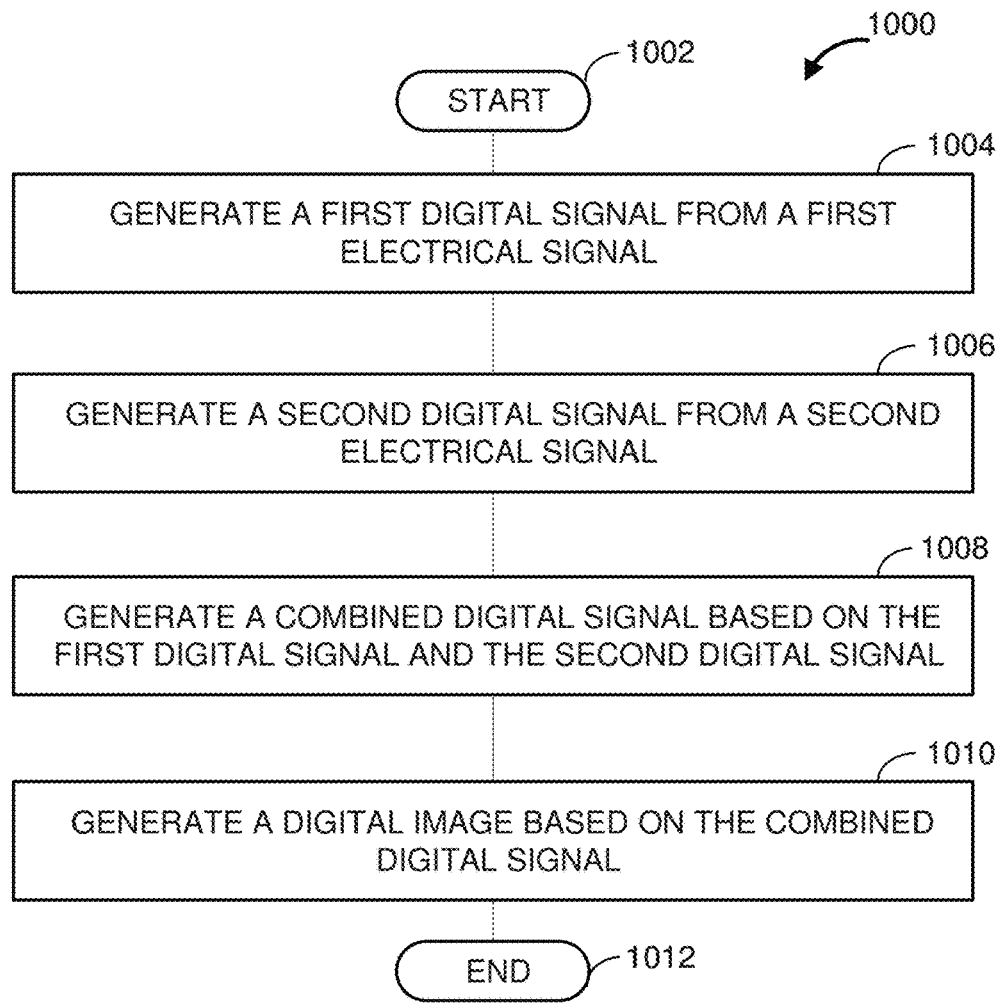

FIG. 10 is a flowchart of a method of capturing an image via an image sensor, according to some embodiments. The method 1000 may begin at block 1002 and proceed to block 1004. At block 1004, the method 1000 may generate a first digital signal from a first electrical signal. As described herein, light may be received at a first photodetector included within a first sensor portion of the image sensor. The first photodetector may convert at least a portion of the received light to a first electrical signal. A first digital signal may be generated from the first electrical signal. The method 1000 may then proceed to block 1006. At block 1006, the method 1000 may generate a second digital signal from a second electrical signal. As described herein, light may be received at a second photodetector included within a second sensor portion of the image sensor. The second photodetector may convert at least a portion of the received light to a second electrical signal. A second digital signal may be generated from the second electrical signal. The method 1000 may then proceed to block 1008. At block 1008, the method 1000 may generate a combined digital signal based on the first digital signal and the second digital signal. The method 1000 may then proceed to block 1010. At block 1010, the method 1000 may generate a digital image based on the combined digital signal. The method 1000 may end at block 1012.

Figure 11:
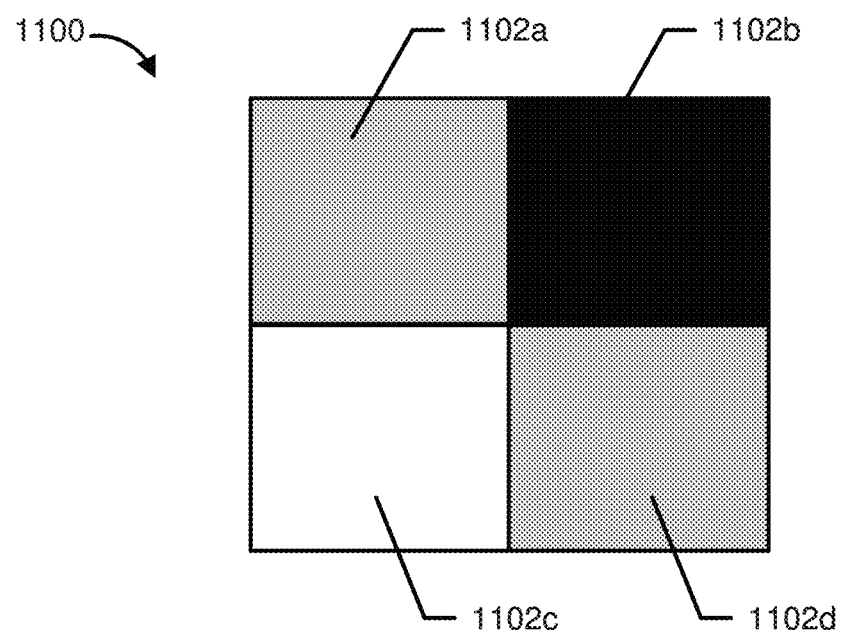
FIG. 11 is a component block diagram showing a top view of an image sensor, according to some embodiments.

FIG. 11 illustrates a top view of image sensor 1100, according to some embodiments. In particular, image sensor 1100 may be arranged as a 2×2 array of sensor elements 1102a, 1102b, 1102c, and 1102d. In some embodiments, the array of sensor elements 1102a-1102d may correspond with one of various color filter arrays or color filter mosaics formed by selectively placing certain color filters on each of the cells in the array. For example, the array of sensor elements 1102a-1102d may correspond to a Bayer filter in which the sensor elements 1102a and 1102d include a color filter that selectively allows only light in the green spectrum to pass through, the sensor cell 1102b may selectively allow only light in the red, NIR, or IR spectrum to pass through, and the sensor cell 1102c may selectively allow only light in the blue spectrum to pass through. Alternatively, the sensor elements 1102a, 1102b, 1102c, and 1102d may be configured with a different color filter array, such as a cyan-yellow-yellow-magenta (CYYM) filter. Further, as described above, each of the sensor elements 1102a-1102d of the image sensor 1100 may correspond with at least one photodetector (not shown) included in the second sensor portion (not shown) and a corresponding photodetector (not shown) included in the first sensor portion (not shown).

While the image sensor 1100 is illustrated in FIG. 11 as having a 2×2 array of sensor elements 1102a-1102d, the image sensor 1100 may be configured with an arbitrary number of one or more sensor elements arranged in a two-dimensional array of sensor elements. For example, the image sensor 1100 may include a 1×1, 640×480, or 4000× 3000 matrix of sensor elements.

Figure 12:
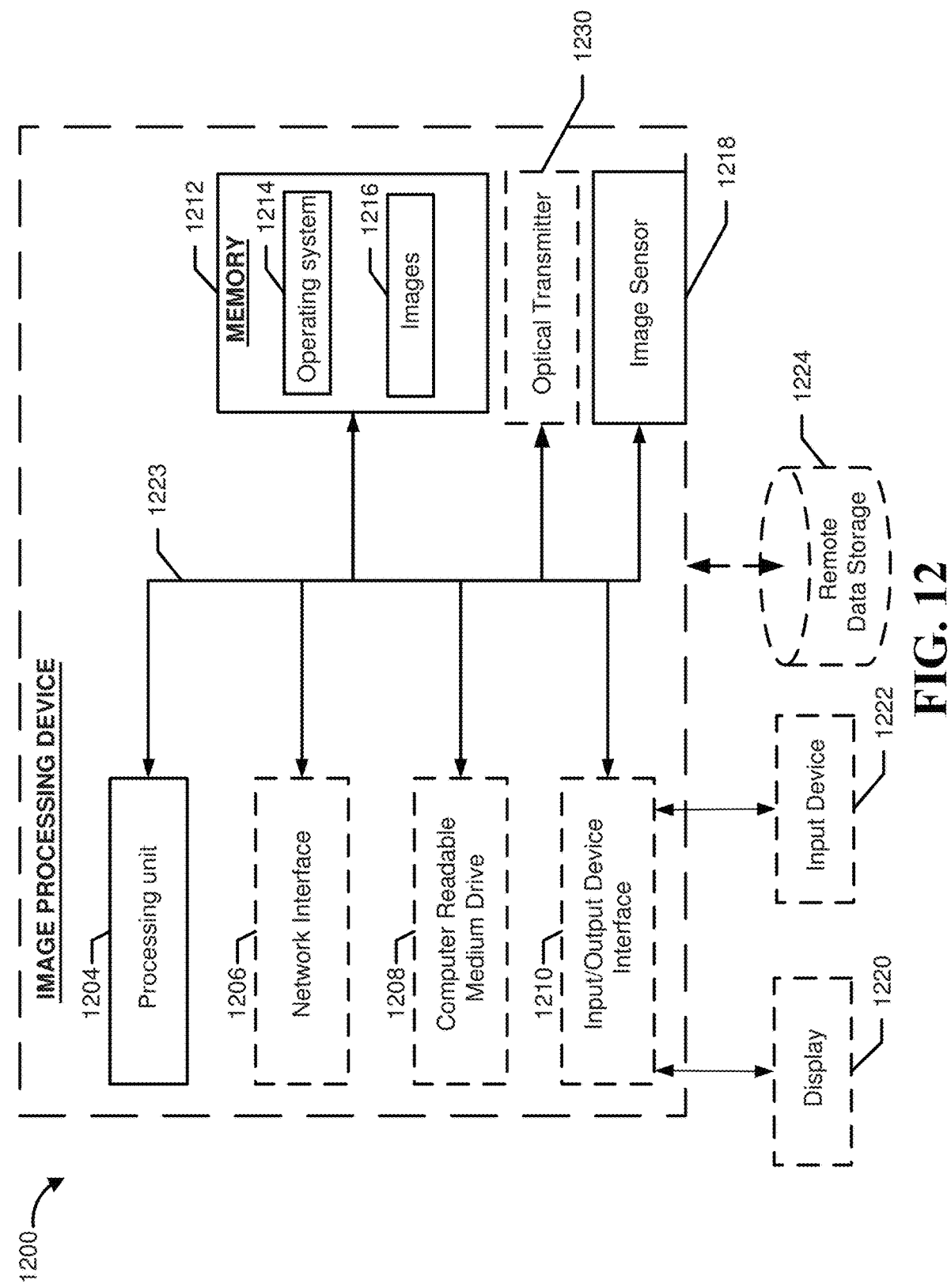
FIG. 12 is a component block diagram illustrating an example of a device suitable for use with some embodiments.

FIG. 12 depicts a general architecture of a device 1200 (e.g., referred to herein as image processing device) that includes an image sensor 1218, according to various embodiments. The general architecture of image processing device 1200 depicted in FIG. 12 includes an arrangement of computer hardware and software components that may be used to implement aspects of the present disclosure. The image processing device 1200 may include many more (or fewer) elements than those shown in FIG. 12. It is not necessary, however, that all of these generally conventional elements be shown in order to provide an enabling disclosure. Although the various components are illustrated as separate components, in some examples two or more of the components may be combined to form a system on chip (SoC). The various components illustrated in FIG. 12 may be formed in one or more microprocessors, application specific integrated circuits (ASICs), field programmable gate arrays (FPGAs), digital signal processors (DSPs), or other equivalent integrated or discrete logic circuitry.

As illustrated, image processing device 1200 (e.g., referred to herein as image processing device) may include a processing unit 1204, an optional network interface 1206, an optional computer readable medium drive 1208, an input/output device interface 1210, an optional display 1220, and an optional input device 1222, all of which may communicate with one another by way of a communication bus 1223. Communication bus 1223 may be any of a variety of bus structures, such as a third-generation bus (e.g., a HyperTransport bus or an InfiniBand bus), a second generation bus (e.g., an Advanced Graphics Port bus, a Peripheral Component Interconnect (PCI) Express bus, or an Advanced eXentisible Interface (AXI) bus) or another type of bus or device interconnect. It should be noted that the specific configuration of buses and communication interfaces between the different components shown in FIG. 12 is merely exemplary, and other configurations of devices and/or other image processing devices with the same or different components may be used to implement the techniques of this disclosure.

The processing unit 1204 may comprise a general-purpose or a special-purpose processor that controls operation of image processing device 1200. The network interface 1206 may provide connectivity to one or more networks or computing systems. For example, the processing unit 1204 may receive and/or send information and instructions from/to other computing systems or services via one or more networks (not shown). The processing unit 1204 may also communicate to and from a memory 1212 and may further provide output information for the optional display 1220 via the input/output device interface 1210.

The optional display 1220 may be external to the image processing device 1200 or, in some embodiments, may be part of the image processing device 1200. The display 1220 may comprise an LCD, LED, or OLED screen, and may implement touch sensitive technologies. The input/output device interface 1210 may also accept input from the optional input device 1222, such as a keyboard, mouse, digital pen, microphone, touch screen, gesture recognition system, voice recognition system, or another input device known in the art.

The memory 1212 may include computer- or processor-executable instructions (grouped as modules or components in some embodiments) that the processing unit 1204 may execute in order to perform various operations. The memory 1212 may generally include random-access memory ("RAM"), read-only memory ("ROM"), and/or other persistent, auxiliary, or non-transitory computer-readable media. The memory 1212 may store an operating system 1214 that provides computer program instructions for use by the processing unit 1204 in the general administration and operation of the image processing device 1200. The memory 1212 may further include computer program instructions and other information for implementing aspects of the present disclosure. In addition, the memory 1212 may communicate with an optional remote data storage 1224.

In some embodiments, the memory 1212 may store or include digital representations of images 1216 obtained on the image processing device 1200. In some embodiments, the images 1216 stored in the memory 1212 may include images captured using an image sensor 1218 (e.g., any image sensor described herein). The image processing device 1200 may include optical transmitter 105 of FIG. 1, shown in FIG. 12 as optical transmitter 1230. Optical receiver 104 of FIG. 1 may include image sensor 1218. The image sensor 1218 may convert visible, NIR, or IR light into a digital signal, which may be stored as one or more images in the memory 1212. The images may be stored in one or more image file formats, such as a bitmap or raster format (e.g., JPEG, GIF, and BMP) or as vector graphic formats (e.g., scalable vector graphics or "SVG" format). In some embodiments, the images 1216 may include images received over a network (not shown) via the network interface 1206. In such examples, the images 1216 may include image files receives from a website, from a network device, or from an optional remote data storage 1224.

In some embodiments, the processing unit 1204 may utilize the input/output device interface 1210 to display or output an image on the display 1220. For example, the processing unit 1204 may cause the input/output device interface 1210 to display one of the images 1216 for a user of the image processing device 1200.

The detailed description is directed to certain specific embodiments of the invention. However, the invention can be embodied in a multitude of different ways. It should be apparent that the aspects herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to, or other than one or more of the aspects set forth herein.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

All of the processes described herein may be embodied in, and fully automated via, software code modules executed by a computing system that includes one or more computers or processors. The code modules may be stored in any type of non-transitory computer-readable medium or other computer storage device. Some or all the methods may be embodied in specialized computer hardware.

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

The various illustrative logical blocks and modules described in connection with the embodiments disclosed herein can be implemented or performed by a machine, such as a processing unit or processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can include electrical circuitry configured to process computer-executable instructions. In another embodiment, a processor includes an FPGA or other programmable device that performs logic operations without processing computer-executable instructions. A processor can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor may also include primarily analog components. A computing environment can include any type of computer system, including, but not limited to, a computer system based on a microprocessor, a mainframe computer, a digital signal processor, a portable computing device, a device controller, or a computational engine within an appliance, to name a few.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

Any process descriptions, elements or blocks in the flow diagrams described herein and/or depicted in the attached figures should be understood as potentially representing modules, segments, or portions of code which include one or more executable instructions for implementing specific logical functions or elements in the process. Alternate implementations are included within the scope of the embodiments described herein in which elements or functions may be deleted, executed out of order from that shown, or discussed, including substantially concurrently or in reverse order, depending on the functionality involved as would be understood by those skilled in the art.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A device, comprising:
  a first sensor portion including a first photodetector;
  a second sensor portion including a second photodetector, the second sensor portion positioned above the first sensor portion; and
  a combined metal-interconnect layer between the first photodetector and the second photodetector, the combined metal-interconnect layer forming a light pipe including a channel formed by a plurality of layers, the plurality of layers including:
    a first layer; and
    a second layer spaced apart from the first layer along an axis of the channel.

2. The device of claim 1, wherein the second layer includes a second plurality of metal portions including a first metal portion of an optical metal trace and a second metal portion of a metal interconnect trace.

3. The device of claim 1, wherein the first layer includes a first optical metal trace and the second layer includes a second optical metal trace.

4. The device of claim 1, wherein the first layer includes a first metal interconnect trace and the second layer includes a second metal interconnect trace.

5. The device of claim 1, wherein the second layer is spaced apart from the first layer by a distance greater than 0.0 microns and less than or equal to approximately 0.5 microns.

6. The device of claim 1, further comprising:
  an optical transmitter configured to transmit a source light; and
  an optical receiver configured to receive reflections of the source light, the optical receiver including the first sensor portion and the second sensor portion.

7. The device of claim 1, wherein the light pipe is configured to guide light that passes through the second sensor portion to the first sensor portion via the channel formed by the plurality of layers.

8. The device of claim 1, wherein the first layer includes a first plurality of metal portions including a first metal portion of an optical metal trace and a second metal portion of a metal interconnect trace.

9. The device of claim 8, wherein the optical metal trace includes a plurality of edges including a first edge and a second edge opposite the first edge and the metal interconnect trace includes a plurality of edges including a third edge and a fourth edge opposite the third edge.

10. The device of claim 9, wherein the first edge of the optical metal trace is coupled to the third edge of the metal interconnect trace and the second edge of the optical metal trace is spaced apart from the fourth edge of the metal interconnect trace.

11. The device of claim 9, wherein the first edge of the optical metal trace is spaced apart from the third edge of the metal interconnect trace.

12. The device of claim 9, wherein the first and second edges of the optical metal trace are spaced apart from the third and fourth edges of the metal interconnect trace.

13. The device of claim 9, wherein the first edge of the optical metal trace is coupled to the metal interconnect trace and the second edge of the optical metal trace is spaced apart from the metal interconnect trace.

14. The device of claim 9, wherein the third edge of the metal interconnect trace is coupled to the optical metal trace and the fourth edge of the metal interconnect trace is spaced apart from the optical metal trace.

15. The device of claim 1, wherein a first perimeter of the first layer extends continuously about the axis of the channel and a second perimeter of the second layer extends continuously about the axis of the channel.

16. The device of claim 15, wherein the first perimeter is equal to the second perimeter.

17. The device of claim 1, wherein the combined metal-interconnect layer includes a first metal-interconnect layer within the first sensor portion and a second metal interconnect layer within the second sensor portion.

18. The device of claim 17, wherein the light pipe includes a first light pipe including a first channel formed by a first plurality of layers within the first metal-interconnect layer and a second light pipe including a second channel formed by a second plurality of layers within the second metal-interconnect layer.

19. The device of claim 18, wherein the first plurality of layers forming the first channel of the first light pipe have a first perimeter that extends about the axis and the second plurality of layers forming the second channel of the second light pipe have a second perimeter that extends about the axis, wherein the first perimeter is larger than the second perimeter.

20. The device of claim 1, further comprising:
a processor.

21. The device of claim 20, wherein the processor is configured to:
generate a first digital signal from a first electrical signal;
generate a second digital signal from a second electrical signal;
generate a combined digital signal based on the first digital signal and the second digital signal; and
generate a digital image based on the combined digital signal.

22. A method, comprising:
receiving light via an optical receiver, the optical receiver including an image sensor, the image sensor including:
a first sensor portion including a first photodetector;
a second sensor portion including a second photodetector, the second sensor portion positioned above the first sensor portion;
a combined metal-interconnect layer between the first photodetector and the second photodetector, the combined metal-interconnect layer forming a light pipe including a channel formed by a plurality of layers, including:
a first layer; and
a second layer spaced apart from the first layer along an axis of the channel.

23. The method of claim 22, further comprising:
transmitting a source light via an optical transmitter, wherein the optical receiver receives reflections of the source light.

24. The method of claim 22, further comprising:
generating, via a processor, a first digital signal from a first electrical signal;
generating, via the processor, a second digital signal from a second electrical signal;
generating, via the processor, a combined digital signal based on the first digital signal and the second digital signal; and
generating, via the processor, a digital image based on the combined digital signal.

25. The method of claim 22, wherein the light pipe is configured to guide light that passes through the second sensor portion to the first sensor portion via the channel formed by the plurality of layers.

26. The method of claim 22, wherein the first layer includes a first plurality of metal portions including a first metal portion of an optical metal trace and a second metal portion of a metal interconnect trace.

27. The method of claim 26, wherein the optical metal trace includes a plurality of edges including a first edge and a second edge opposite the first edge and the metal interconnect trace includes a plurality of edges including a third edge and a fourth edge opposite the third edge.

28. The method of claim 27, wherein the first edge of the optical metal trace is coupled to the third edge of the metal interconnect trace and the second edge of the optical metal trace is spaced apart from the fourth edge of the metal interconnect trace.

29. The method of claim 27, wherein the first edge of the optical metal trace is spaced apart from the third edge of the metal interconnect trace.

30. The method of claim 27, wherein the first and second edges of the optical metal trace are spaced apart from the third and fourth edges of the metal interconnect trace.

31. The method of claim 27, wherein the first edge of the optical metal trace is coupled to the metal interconnect trace and the second edge of the optical metal trace is spaced apart from the metal interconnect trace.

32. The method of claim 27, wherein the third edge of the metal interconnect trace is coupled to the optical metal trace and the fourth edge of the metal interconnect trace is spaced apart from the optical metal trace.

* * * * *